United States Patent [19]
Okamura

[11] Patent Number: 5,812,478
[45] Date of Patent: Sep. 22, 1998

[54] SEMICONDUCTOR MEMORY HAVING IMPROVED DATA BUS ARRANGEMENT

[75] Inventor: Junichi Okamura, Kanagawa-ken, Japan

[73] Assignee: Kabushiki Kaisha Toshiba, Tokyo, Japan

[21] Appl. No.: 651,418

[22] Filed: May 22, 1996

Related U.S. Application Data

[63] Continuation-in-part of Ser. No. 582,675, Jan. 4, 1996.

[30] Foreign Application Priority Data

Jan. 5, 1995 [JP] Japan ................................ 7-00128

[51] Int. Cl.[6] .................. G11C 8/00; G11C 7/00
[52] U.S. Cl. ................ 365/230.03; 365/230.08; 365/189.05
[58] Field of Search ............ 365/230.03, 23.08, 365/189.05

[56] References Cited

U.S. PATENT DOCUMENTS

| | | | |
|---|---|---|---|
| 5,303,192 | 4/1994 | Baba .................................... | 365/200 |
| 5,412,613 | 5/1995 | Galbi et al. ...................... | 365/230.03 |
| 5,416,741 | 5/1995 | Ohsawa ............................... | 365/200 |
| 5,444,305 | 8/1995 | Matsui .............................. | 365/230.03 |
| 5,491,664 | 2/1996 | Phelan ................................ | 365/200 |
| 5,499,215 | 3/1996 | Hatta ................................ | 365/230.03 |
| 5,502,675 | 3/1996 | Kohno et al. .......................... | 365/200 |

*Primary Examiner*—David C. Nelms
*Assistant Examiner*—Trong Quang Phan
*Attorney, Agent, or Firm*—Loeb & Loeb LLP

[57] ABSTRACT

A semiconductor memory including first, second, and third data busses, and first and second memory cell arrays arranged among the first, second, and third data busses. During operation of the semiconductor memory, a first, a second, and a third circuit selectively couple the first, second, and third data busses to a fourth and a fifth data bus. Additionally, there is provided first and second buffer circuits, which are respectively coupled to the fourth and the fifth data busses, and a sixth data bus, which is commonly coupled to the first and second buffer circuits. A control circuit is used to control the operation of the switch circuits. In preferred embodiments, the number of buffer circuits in the semiconductor memory is less than or equal to the number of memory cell arrays.

65 Claims, 17 Drawing Sheets

SEMICONDUCTOR MEMORY HAVING IMPROVED DATA BUS ARRANGEMENT

RELATED APPLICATION

This is a continuation-in-part of application Ser. No. 08/582,675 filed Jan. 4, 1996.

FIELD OF THE INVENTION

The present invention relates to a semiconductor memory, and more specifically to an arrangement and connecting relationship of data busses and buffer circuits in the core portions of a DRAM (dynamic-type random access memory).

BACKGROUND OF THE INVENTION

In this specification, it is assumed that the circuits are operating under positive logic. Specifically, an "H" level signal is equal to logic 1, which is approximately the internal power source potential Vcc (or at least a voltage high enough to turn a transistor on when applied to its gate if the potential at its source is approximately the ground potential Vss). An "L" level signal is equal to logic 0, which is approximately the ground potential Vss.

FIG. 17 shows an outline of the arrangement of memory cell arrays, data busses and buffer circuits and their connecting relationship in a conventional DRAM. The conventional DRAM includes memory cell arrays 1-1 and 1-2, data busses 2-1, 2-2 and 2-3 (hereinafter, DQ lines), buffer circuits 4-1, 4-2 and 4-3 (hereinafter, DQ buffers), a data bus 5 (hereinafter, main data bus or RWD line), and row decode circuits 6-1 and 6-2.

As is apparent from FIG. 17, the DQ buffers 4 are arranged adjacent to their respective DQ lines 2 and are located between the row decode circuits 6. It is also necessary to arrange many other circuit elements among the row decode circuits 6 which are located adjacent to the outlets of the DQ lines 2. For example, pre-decode circuits, circuits driving bit line equalizing circuits, circuits driving sense amplifier circuits, redundancy fuse circuits, and sense amplifier bit line connecting switch control circuits (hereinafter, φT control circuits) must be so arranged in a DRAM having a shared sense amplifier structure. However, arranging all of these circuit elements causes the spaces between the row decode circuits 6 to become very crowded. In many cases, the pitch among the memory cell arrays must be increased to remedy this problem Additionally, the number of the DQ buffers required in a conventional DRAM is one more than the number of memory cell arrays. Furthermore, it is also necessary to devise a control for these circuit elements.

Thus, in a conventional semiconductor memory, the arrangement and connecting relationship of data busses and buffer circuits makes it difficult to reduce the chip area; more buffer circuits are necessary than the number of memory cell arrays, and the control of these circuits is difficult.

SUMMARY OF THE INVENTION

In view of these problems, it is the object of the present invention to remove the above-mentioned drawbacks and to provide a semiconductor memory wherein the number of buffer circuits is equal to the number of memory cell arrays and control is facilitated while chip area is reduced.

According to a first embodiment of the present invention, data can be supplied to the first and the second buffer circuits via switches and data busses by newly arranging a first, a second and a third switch circuit and a fourth and a fifth data bus in addition to those in the conventional example. Here, the fourth and fifth data busses are arranged orthogonally to the first, second, and third data busses and extend in the row direction at the ends of the memory cell arrays. Therefore, the buffer circuits can be arranged at the ends of the memory cell arrays and it is not necessary to arrange them at the outlets of the first, second, and third data busses. In operation, when the control circuit selects the first memory cell array, the circuit controls the first switch circuit to couple the first data bus to the fourth data bus, and at the same time controls the second switch circuit to couple the second data bus to the fifth data bus. Similarly, when the control circuit selects the second memory cell array, the circuit controls the second switch circuit to couple the second data bus to the fourth data bus, and at the same time controls the third switch circuit to couple the third data bus to the fifth data bus. Hence, it is possible to have the number of the buffer circuits be equal to the number of memory cell arrays. Accordingly, in the first embodiment of the present invention, the number of buffer circuits is equal to the number of memory cell arrays and control is facilitated while chip area is reduced.

DETAILED DESCRIPTION OF THE PREFERRED EMBODIMENTS

The embodiments of the present invention will be described in detail hereinbelow with reference to the attached drawings. Although the present invention can naturally be used in various semiconductor memories (SRAM, EPROM, MROM, etc.), the description will be given for a DRAM because the present invention has a structure preferable to a DRAM as will be explained.

Figure 1:
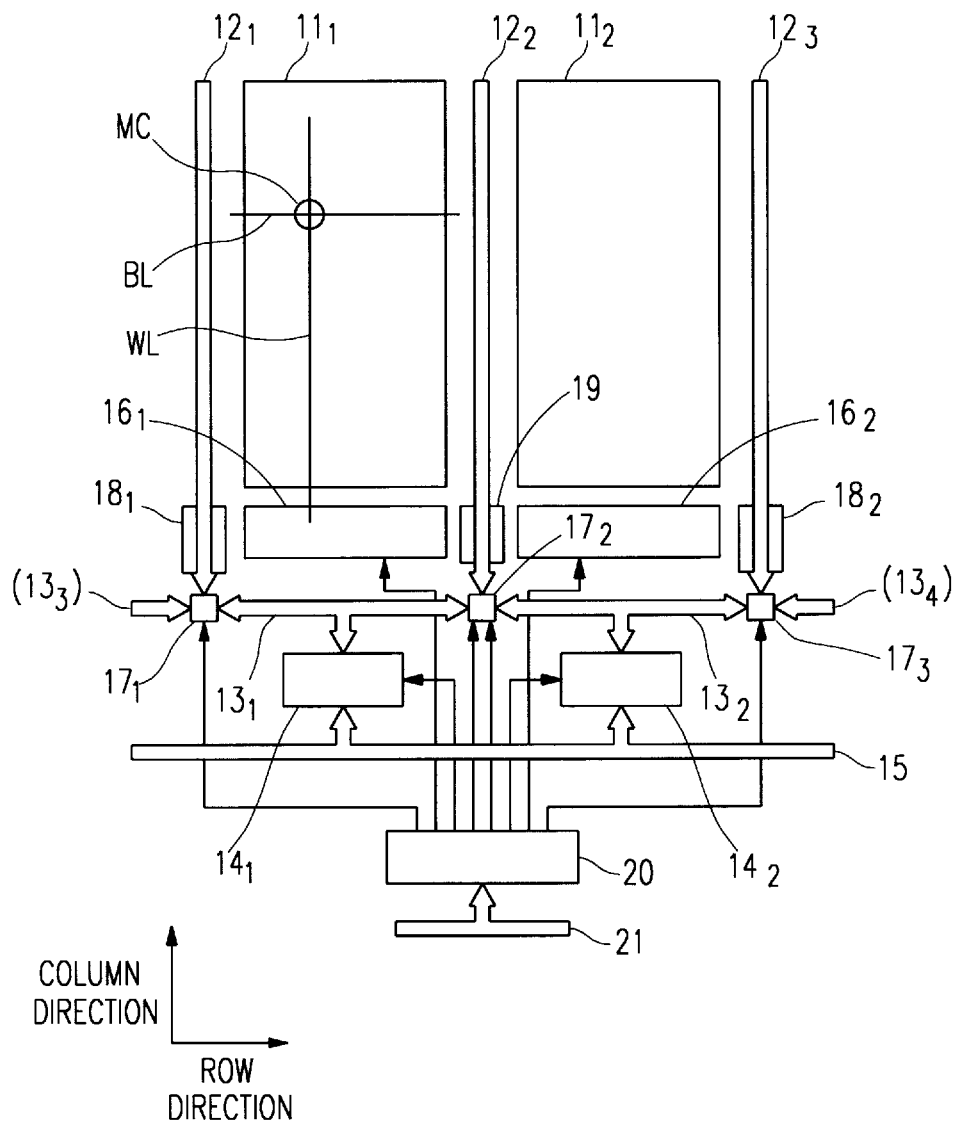
FIG. 1 is a structural view of a circuit showing the essential portions of a first embodiment of the present invention.

FIG. 1 shows a circuit diagram showing only essential portions of a first embodiment of the present invention. FIG. 1 is an outline view of the first embodiment of the present invention showing an arrangement of memory cell arrays, data busses, and buffer circuits and their connecting relationship. This embodiment includes memory cell arrays 11-1 and 11-2, data busses 12-1, 12-2 and 12-3 (hereinafter, DQ lines), data busses 13-1, 13-2, 13-3 and 13-4 (hereinafter, DP lines), buffer circuits 14-1 and 14-2 (hereinafter, DQ buffers), a data bus 15 (hereinafter, main data bus or RWD line), row decode circuits 16-1 and 16-2, switch circuits 17-1, 17-2 and 17-3, pre-decode circuits and pre-decode line drive circuits 18-1 and 18-2, a redundancy fuse circuit 19, a block control circuit 20, and an address and control signal bus 21.

In the memory cell arrays 11-1 and 11-2, dynamic-type memory cells MC composed of one transistor and one capacitor are arranged in a matrix. Memory cells belonging to the same column are coupled to the same pair of bit lines BL, which extend in the row direction, and memory cells belonging to the same row are coupled to the same word line WL, which extends in the column direction. The memory cell arrays are of a shared sense amplifier structure so peripheral circuits, such as sense amplifiers, are arranged at both ends (in the row direction) of a memory cell array. The sense amplifiers, column select transistors, etc. are arranged between the memory cell arrays 11-1 and 11-2 and are commonly used by both of them.

The DQ lines 12 each consist of four pairs of wirings (eight wirings total) extending in the column direction and are arranged among the memory cell arrays 11. The DQ lines (along with the DP lines) transmit data read from the memory cells to the DQ buffers via pairs of bit lines BL and sense amplifiers, not shown, and similarly transfer write data from the DQ buffers to the memory cell arrays. Further, as will be explained, the DQ line 12-1 is commonly used by a memory cell array, not shown, contiguous to the left side (in the row direction) of the figure and the DQ line 12-3 is commonly used by a memory cell array, not shown, contiguous to the right side (in the row direction) of the figure (naturally there is not such a contiguous memory cell array with respect to a memory cell array at the right end or the left end of the core block).

The DP lines 13 each consist of four pairs of wirings (total eight wirings) extending in the row direction and are arranged extending along the ends of the memory cell arrays 11. The DP lines transmit read data from the memory cells (via the bit lines and the DQ lines 12) to the DQ buffers 14 and similarly transmit write data from the DQ buffers to the DQ lines. The DP line 13-3 corresponds to a memory cell array, not shown, contiguous to the left side (in the row direction) of the figure and the DP line 13-4 corresponds to a memory cell array, not shown, contiguous to the right side (in the row direction) of the figure (again, there is not such a contiguous memory cell array and DP line with respect to a memory cell array at the right end or the left end of the core block).

Each DQ buffer 14 is arranged corresponding to a DP line 13 and a memory cell array 11 and is connected to its corresponding DP line 13 and the RWD line 15, which extends in the row direction. The DQ buffers 14 amplify read data supplied by the DP lines 13 and output it to the RWD line 15, and similarly amplify write data supplied by the RWD line 15 and output it to the DP lines 13.

Each row decode circuit 16 is provided corresponding to a memory cell array 11 and drives the word line WL in the memory cell array 11 based on an address signal supplied from the address bus 21. Each of the switch circuits 17 selectively couples the DP lines 13 to the DQ lines 12 under the control of the block control circuit 20. (The specific connections are explained below). The pre-decode circuits and the pre-decode line drive circuits 18 supply pre-decode signals to the adjacent row decode circuits. That is, the row decode circuits 16 are of a partial decode construction and selectively drive the word lines WL based on both the address signal and the pre-decode signals. The redundancy fuse circuit 19 is composed of a fuse array and a comparing circuit for selecting redundancy rows provided in the memory cell array 11 (8 redundancy rows are arranged with respect to 512 rows). The redundancy fuse circuit 19 operates along with the contiguous row decode circuit 16. The block control circuit 20 mainly controls the operations of the switch circuits 17, the DQ buffer circuits 14, and the row decode circuits 16. The control circuit is coupled to the address and control signal bus 21.

Figure 2:
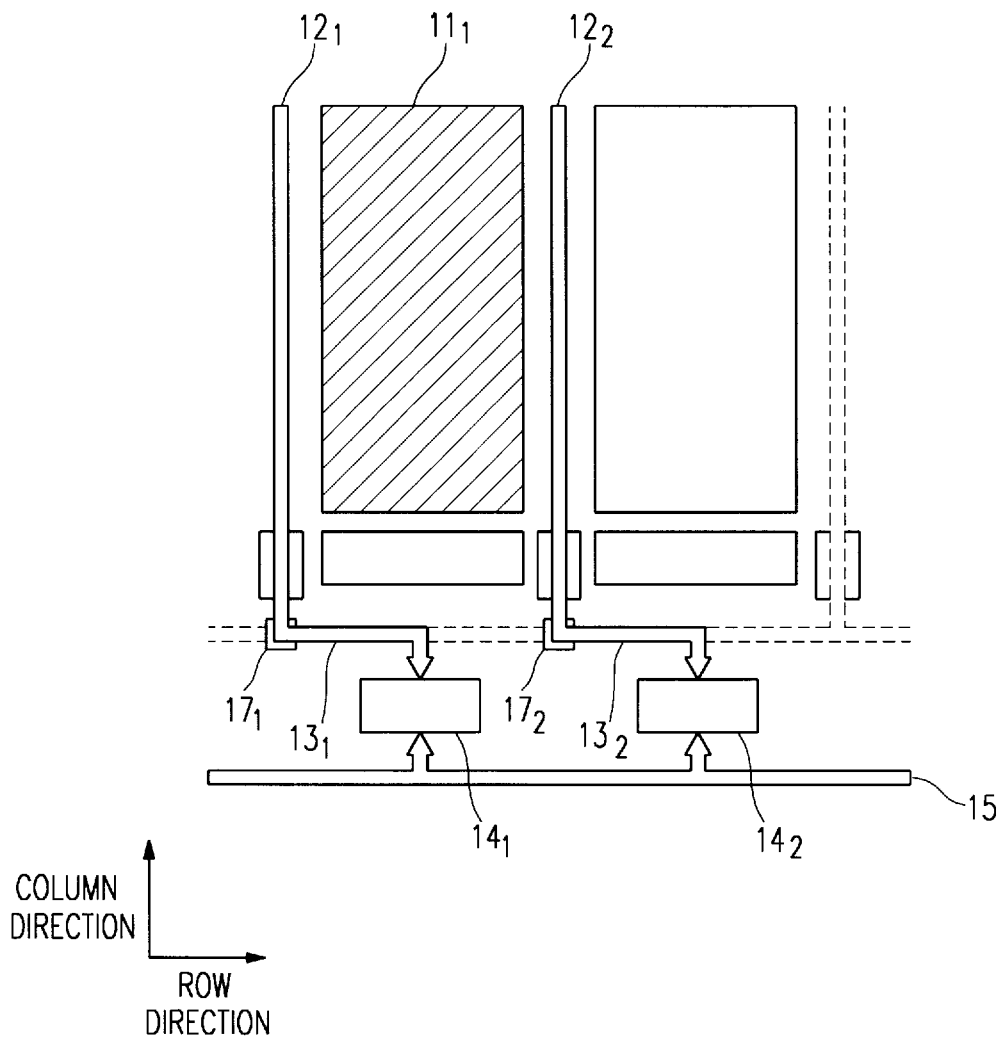
FIG. 2 is a view showing the operation of the circuit shown in FIG. 1.

The operation of the circuits shown in FIG. 1 will now be explained. When, as shown in FIG. 2, memory cells in the first memory cell array 11-1 are selected (that is, when memory cell array 11-1 is selected), the pair of selected bit lines is coupled to the DQ lines 12-1 and 12-2 via column select transistors, not shown. The DQ lines 12-1 and 12-2 on both sides of the selected memory cell array 11-1 are used because the memory cell array is of the shared sense amplifier structure. Additionally, because the memory cell array 11-1 is selected, the switch circuit 17-1 couples the DQ line 12-1 to the DP line 13-1 and the switch circuit 17-2 couples the DQ line 12-2 to the DP line 13-2. As a result, the DQ line 12-1 is coupled to the DQ buffer 14-1 and the DQ line 12-2 is coupled to the DQ buffer 14-2. Thus, in reading data, a very small potential difference between the pair of bit lines (that is, data read from the memory cells) is amplified by a sense amplifier, passes through the DQ lines 12 and the DP lines 13 via the column select transistors, is again amplified by the DQ buffers 14, and is transmitted to the RWD line 15. In writing data, data supplied from the RWD line 15 is amplified by the DQ buffers, passes through the DP lines and the DQ lines, and is transmitted to the pair of selected bit lines via the column select transistors.

Figure 3:
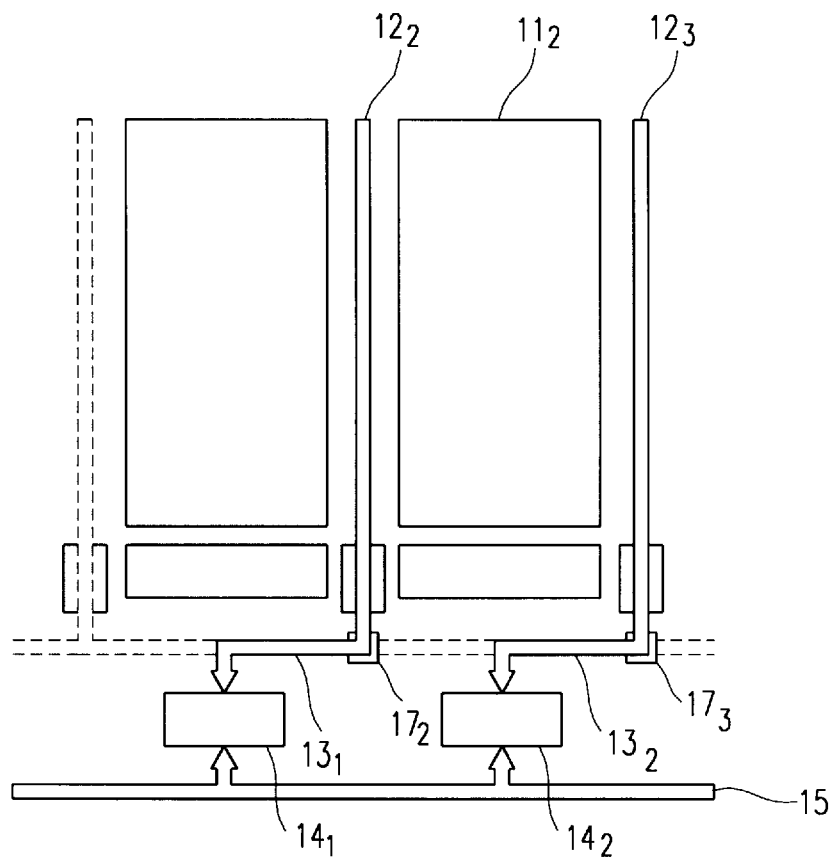
FIG. 3 is another view showing the operation of the circuit shown in FIG. 1.
Figure 3:
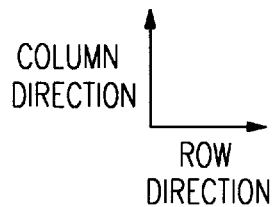

When, as shown in FIG. 3, memory cells in the second memory cell array 11-2 are selected (that is, when the memory cell array 11-2 is selected), the pair of selected bit lines is coupled to the DQ lines 12-2 and 12-3 via the column select transistors, not shown. Because the memory cell array 11-2 is selected, the switch circuit 17-2 couples the DQ line 12-2 to the DP line 13-1 and the switch circuit 17-3 couples the DQ line 12-3 to the DP line 13-2. As a result, the DQ line 12-2 is coupled to the DQ buffer 14-1 and the DQ line 12-3 is coupled to the DQ buffer 14-2. Thus, in reading data, a very small potential difference between the pair of bit lines (that is, data read from the memory cells) is amplified by a sense amplifier, passes through the DQ lines and the DP lines via the column select transistors, is again amplified by the DQ buffers, and is transmitted to the RWD line 15. In writing data, data supplied from the RWD line 15 is amplified by the DQ buffers, passes through the DP lines and the DQ lines, and is transmitted to the pair of selected bit lines via the column select transistors.

As a result of the design of the first embodiment of the present invention, the number of buffer circuits is equal to the number of the memory cell arrays and control is facilitated while area is reduced, as will now be explained.

In the first embodiment of the present invention, the degree of freedom with regard to the positioning of the DQ buffers is greatly enhanced due to the newly provided DP lines 13 corresponding to the memory cell arrays. The DP lines make it unnecessary to provide a DQ buffer at the outlet of each DQ line, as is required in conventional DRAM. Therefore, the pitch among the memory cell arrays can be made dense. The design naturally facilitates arrangement of the various peripheral circuits. Additionally, the switch circuits and DP lines are used to prescribe the directions for transmitting data and therefore, the number of DQ buffers can be equal to the number of memory cell arrays. This contributes to a considerable reduction in area in comparison with the conventional case wherein the number of the DQ buffers required is one more than the number of memory cell arrays.

Furthermore, under the conventional circuit structure, control of the circuits (block control) is comparatively complicated because it is necessary to select two of the N+1 DQ buffers and one of the N row decode circuits. However, in the first embodiment of the present invention, the number of DQ buffers is equal to the number of row decode circuits and the block control circuit always selects only two of them Accordingly, the control structure can be much more simplified than in the conventional case.

An explanation will now be given of the first embodiment of the present invention, including the circuit structure of FIG. 1 and other peripheral portions, in reference to FIGS. 4 through 10.

Figure 4:
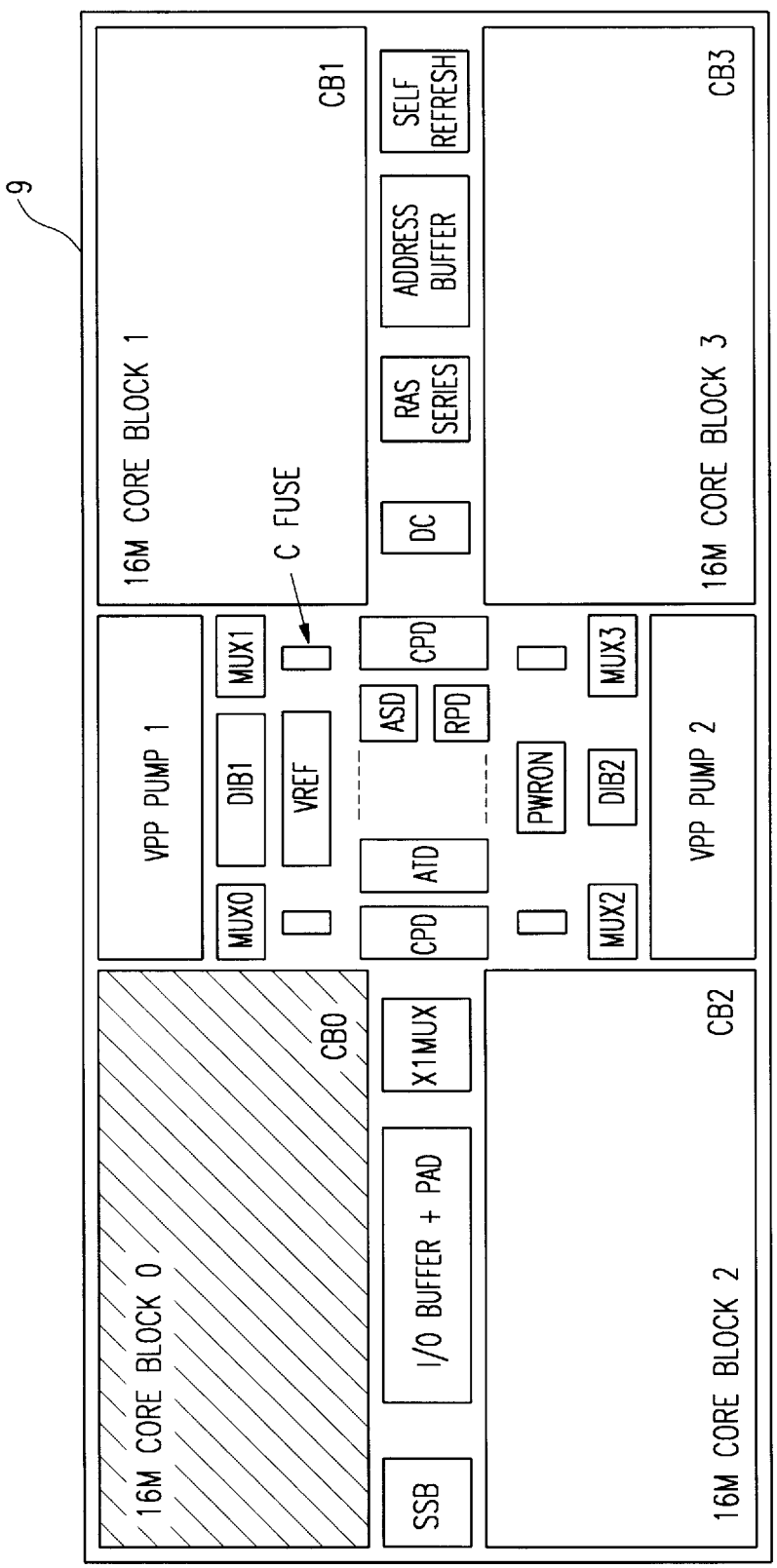
FIG. 4 is a plane view showing an embodiment of the present invention.

FIG. 4 shows an outline structural view of a DRAM of the first embodiment of the present invention. The total memory capacity is assumed to be 64M bits. Core blocks CB0, CB1, CB2 and CB3 are arranged in a semiconductor chip 9. Each core block CB is composed of 16M bits of memory cells and their peripheral circuits, such as sense amplifiers, decoders and the like. Vpp generating circuits (Vpp Pump1 and Vpp Pump2), for generating a boosted voltage Vpp of a word line, are respectively arranged between CB0 and CB1, and CB2 and CB3. Data multiplexer circuits (MUX0 through MUX3) and data buffer circuits (DIB1 and DIB2) are arranged at data output units of the core blocks CB. A fuse array CFUSE, for holding replaced data of the column redundancy circuits, is located adjacent to each of the core blocks. A reference potential generating circuit VREF, for generating a reference or intermediate potential of ½ Vcc, is arranged between CB0 and CB1. A power-on reset circuit PWRON, for generating an initializing signal when the chip is initialized with the power source on, is arranged between CB2 and CB3. A substrate potential generating circuit SSB, a data input/output buffer (I/O Buffer and Pad), and an I/O data multiplexer circuit X1MUX, for selecting Pad in accordance with data output width, are successively arranged between CB0 and CB2. A self refresh control circuit (Self Refresh), an address buffer (Address Buffer), a row series control circuit (RAS Series), and a data control circuit DC are successively arranged between CB1 and CB3. Additionally, column partial decoder circuits CPD, an address transition detection circuit ATD, a row partial decoder circuit RPD, and a column address switch circuit ASD are arranged at the central portion of the chip 9.

Figure 5:
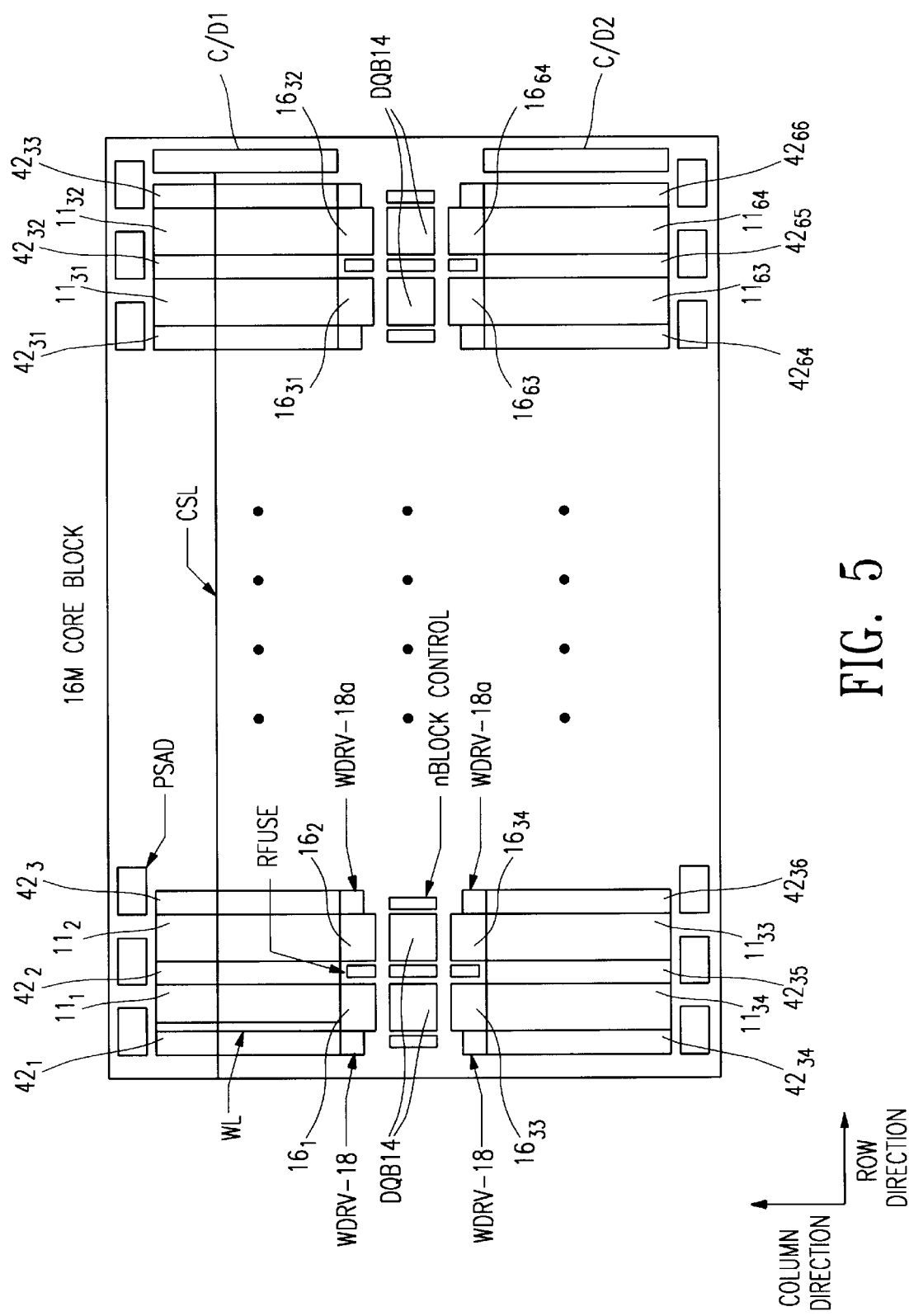
FIG. 5 is a structural diagram showing in detail essential portions of FIG. 4.

FIG. 5 shows the structure of a 16M bits core block CB. Sixty-four sets of 256K bit memory cell arrays 11-1 through 11-64 and sixty-six sets of peripheral circuits within the core section 42-1 through 42-66 are alternately arranged to form a memory cell block. Column decoder circuits (C/D1 and C/D2) are arranged at one end of the core block. A plurality of column select lines CSL, which extend in the row direction, are selectively driven by the column decoder circuits C/D. The column select lines CSL supply select signals to the peripheral circuits within the core section 42 at each row belonging to the same column. Specifically, the column select lines are used for partial activation of the sense amplifier circuits and for driving the column gate circuits. The memory cell block is divided into top and bottom groups of memory cell arrays. Between these two groups are arranged row decoder circuits 16-1 through 16-64, for selectively driving word lines WL by internal row address signals (each row decoder circuit corresponds to a memory cell array); drive circuits WDRV 18, for supplying drive signals to the row decoder circuits; fuse circuits RFUSE 19, for holding replaced data of row redundancy circuits; DQ buffers DQB 14; a block control circuit BC; and the like. P-channel type sense amplifier drive circuits PSAD, each corresponding to a peripheral circuit within the core section, are arranged at peripheral portions of the core block CB. These circuits combine to form a 16M bits core block CB. By arranging the row decoder circuits 16 and the DQ buffers 14 as shown in FIG. 5, it is possible to densely arrange all of the circuit elements and thus provide a large capacity DRAM with a smaller chip area.

Figure 6:
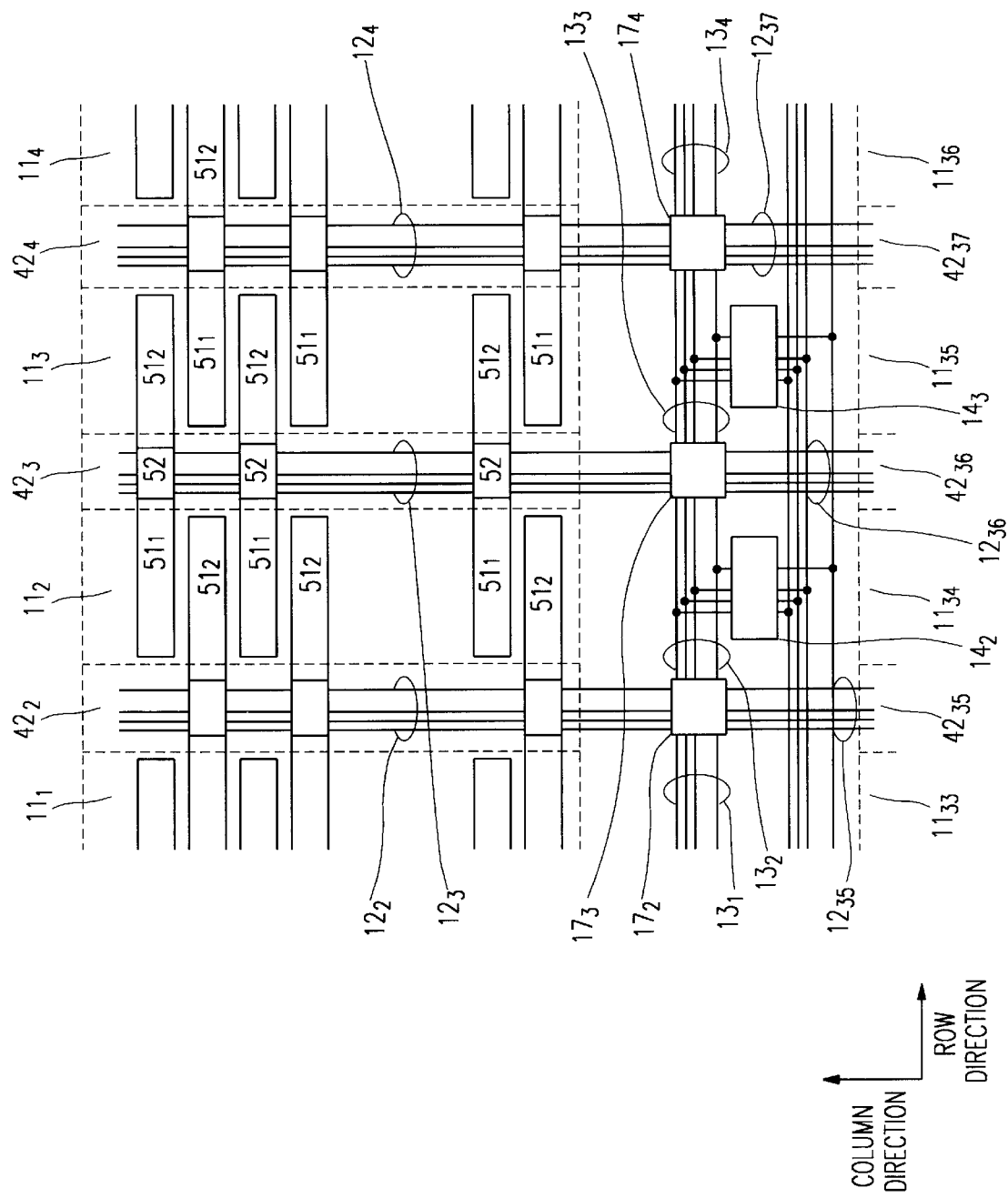
FIG. 6 is a structural diagram showing in more detail the essential portions of FIG. 5.

FIG. 6 shows in detail the internal circuit construction of a region including the memory cell arrays 11-1, 11-2, 11-3, 11-4, 11-33, 11-34, 11-35 and 11-36. The memory cell arrays 11 and the peripheral circuits within the core 42 are alternately arranged and the DQ lines 12 are extended in parallel with each other on the peripheral circuits within the core. The memory cell arrays are of the shared sense amplifier structure and pairs of bit lines (51-1 and 51-2), which are composed of four pairs of bit lines selected by the same column select line CSL, are connected to the left and right of one sense amplifier block 52. In the memory cell array structure, the bit line blocks, each composed of a sense amplifier block 52 and a pair of bit lines 51-1 and 51-2, are positioned in a staggered arrangement. Through this structure, the sense amplifier blocks 52 are continuously arranged in the peripheral circuits within the core section 42 and the group of pairs of bit lines 51-1 and 51-2 are alternately arranged in the memory cell arrays 11. The DQ lines 12 are coupled to the corresponding sense amplifier blocks 52. In this way, although omitted for simplification in FIG. 1, the switch circuits 17 operate as exchange switches to output data from either the top half of the memory cell arrays (11-1 through 11-4) or the bottom half of the memory cell arrays (11-33 through 11-36). Accordingly, in this embodiment of the present invention the required number of buffer circuits 14 can be halved.

Figure 7:
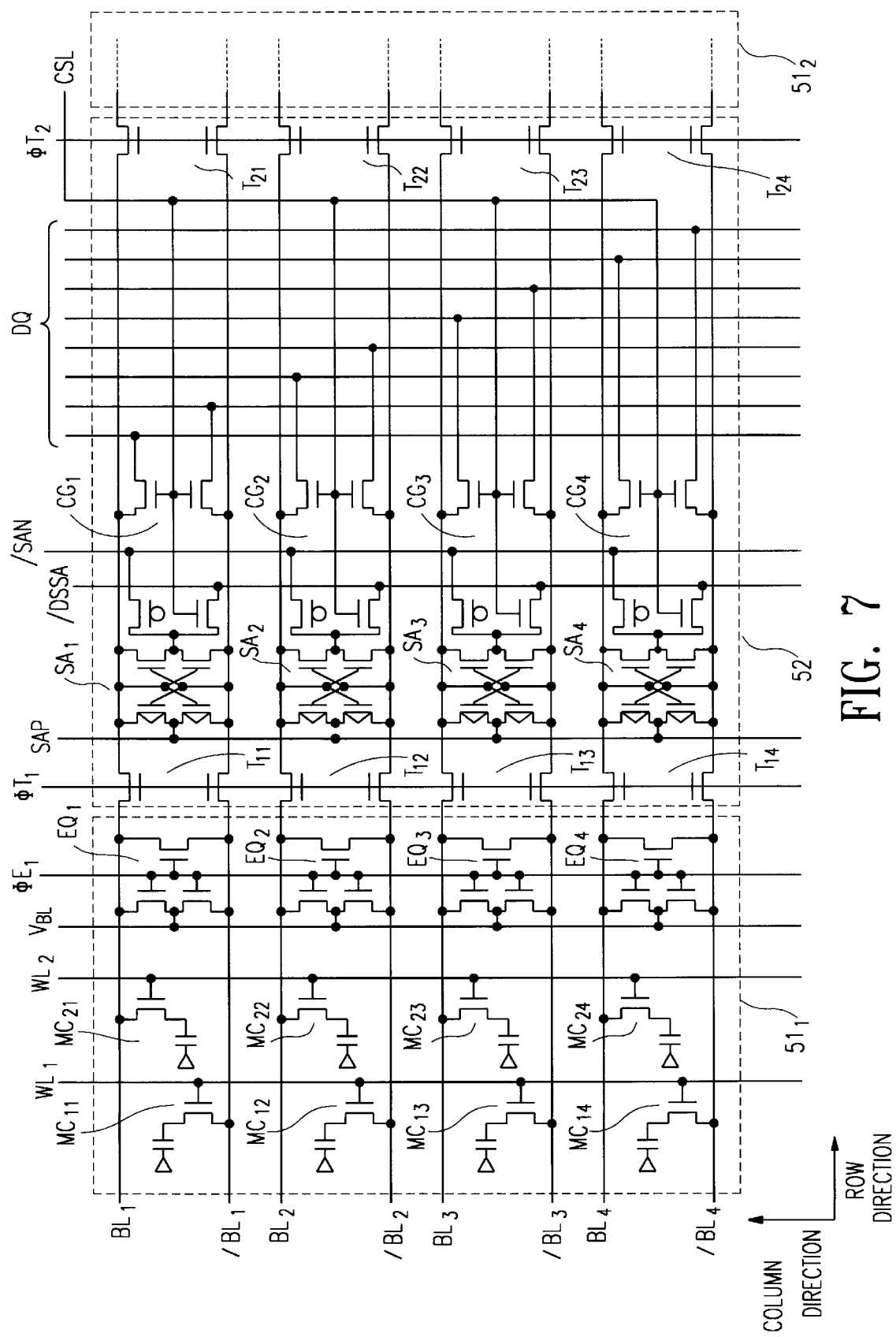
FIG. 7 is a circuit diagram showing in more detail the essential portions of FIG. 6.

FIG. 7 shows in more detail the circuit structure of the left side group of pairs of bit lines 51-1, the sense amplifier block 52, and the right side group of pairs of bit lines 51-2. The left side group of pairs of bit lines 51-1 is composed of four pairs of bit lines (BL1 and /BL1 through BL4 and /BL4) which are coupled to dynamic-type memory cells (MC11 through MC24) in a matrix. Memory cells MC11 through MC14 are selectively driven by one word line WL1 and memory cells MC21 through MC24 are selectively driven by another word line WL2. The respective pairs of bit lines are connected to equalization circuits (EQ1 through EQ4) which, when driven by a signal φE1, couple VBL (a constant voltage of ½ Vcc) to the pairs of bit lines in an equalizing operation.

The sense amplifier block 52 is composed of sense amplifiers SA1 through SA4 coupled to the respective pairs of bit lines and pairs of column select transistors CG1 through CG4 which are selectively driven by the same column select line CSL. Further, the sense amplifier block 52 includes switch circuits T11 through T14 (driven by the same control signal φT1) for selectively coupling the sense amplifier block 52 to the left side group of pairs of bit lines 51-1, and switch circuits T21 through T24 (driven by a same control signal φT2) for selectively coupling the right side group of pairs of bit lines 51-2 to the sense amplifier block 52. Each sense amplifier SA is composed of a pair of P-channel MOS transistors and a pair of N-channel MOS transistors. The pair of the P-channel MOS transistors is driven by one signal SAP and the pair of N-channel MOS transistors is driven by two other signals /DSSA and /SAN. The reason for separating the /DSSA and /SAN signals is to activate sense amplifiers selected by the column select line CSL at a higher speed. As illustrated, four pairs of DQ lines are present to couple with the respective pairs of bit lines via the column select transistors CG1 through CG4.

As previously explained, the pitch of the sense amplifiers (in the column direction) can be made twice as much as the pitch of the pairs of bit lines by adopting the shared sense amplifier structure. This structure reduces the width of the peripheral circuits within the core section (in the row direction) and the data bus arrangement of the present invention is further enhanced. As a result, the shared sense amplifier structure contributes to a further reduction in chip area by combining it with the data bus arrangement of the present invention.

Figure 8:
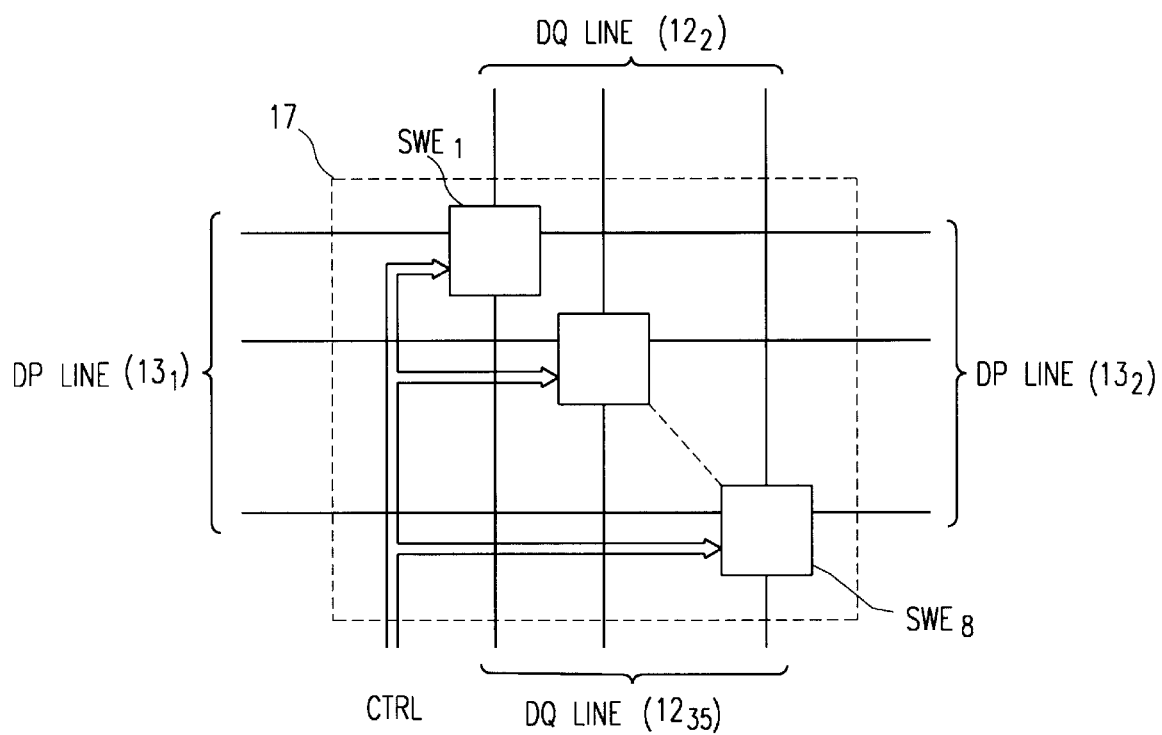
FIG. 8 is a structural view of a circuit showing in more detail other essential portions of FIG. 6.

FIG. 8 shows the internal structure of the switch circuit 17. Bi-directional transmitting switch elements SWE1 through SWE8 are each connected to a top side DQ line (for example, 12-2), a bottom side DQ line (for example, 12-35), a left side DP line (for example, 13-1) and a right side DP line (for example, 13-2). All of the switch elements SWE in a switch circuit 17 are controlled by the same control signals CTRL.

Figure 9:
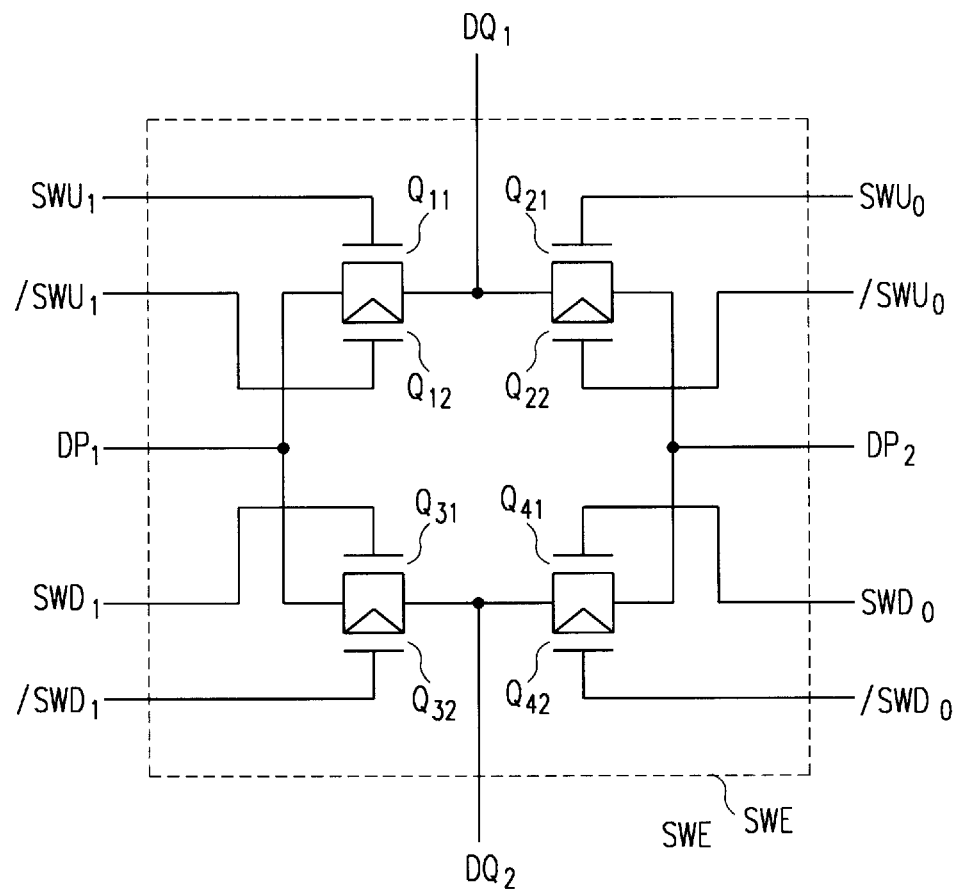
FIG. 9 is a circuit diagram showing in more detail the essential portion of FIG. 8.

FIG. 9 shows in greater detail the internal circuit structure of a switch element SWE. The switch element is composed of N-channel MOS transistors Q11, Q21, Q31 and Q41 and P-channel MOS transistors Q12, Q22, Q32 and Q42. The transistors combine to form four transmit gates, each of which is driven by complementary control signals. Specifically, when signal SWU1 is at "H" level and signal /SWU1 is at "L" level, DQ1 and DP1 are coupled, and when signal SWU0 is at "H" level and signal /SWU0 is at "L" level, DQ1 and DP2 are coupled. Similarly, when signal SWD1 is at "H" level and signal /SWD1 is at "L" level, DQ2 and DP1 are coupled, and when signal SWD0 is at "H" level and signal /SWD0 is at "L" level, DQ2 and DP2 are coupled. The control signals are supplied by the block control circuit 20. Through this design, the number of transistors in a switch circuit is kept low so it is possible to easily arrange the switch circuits between the row decode circuits 6 or at their peripheral portions.

Figure 10:
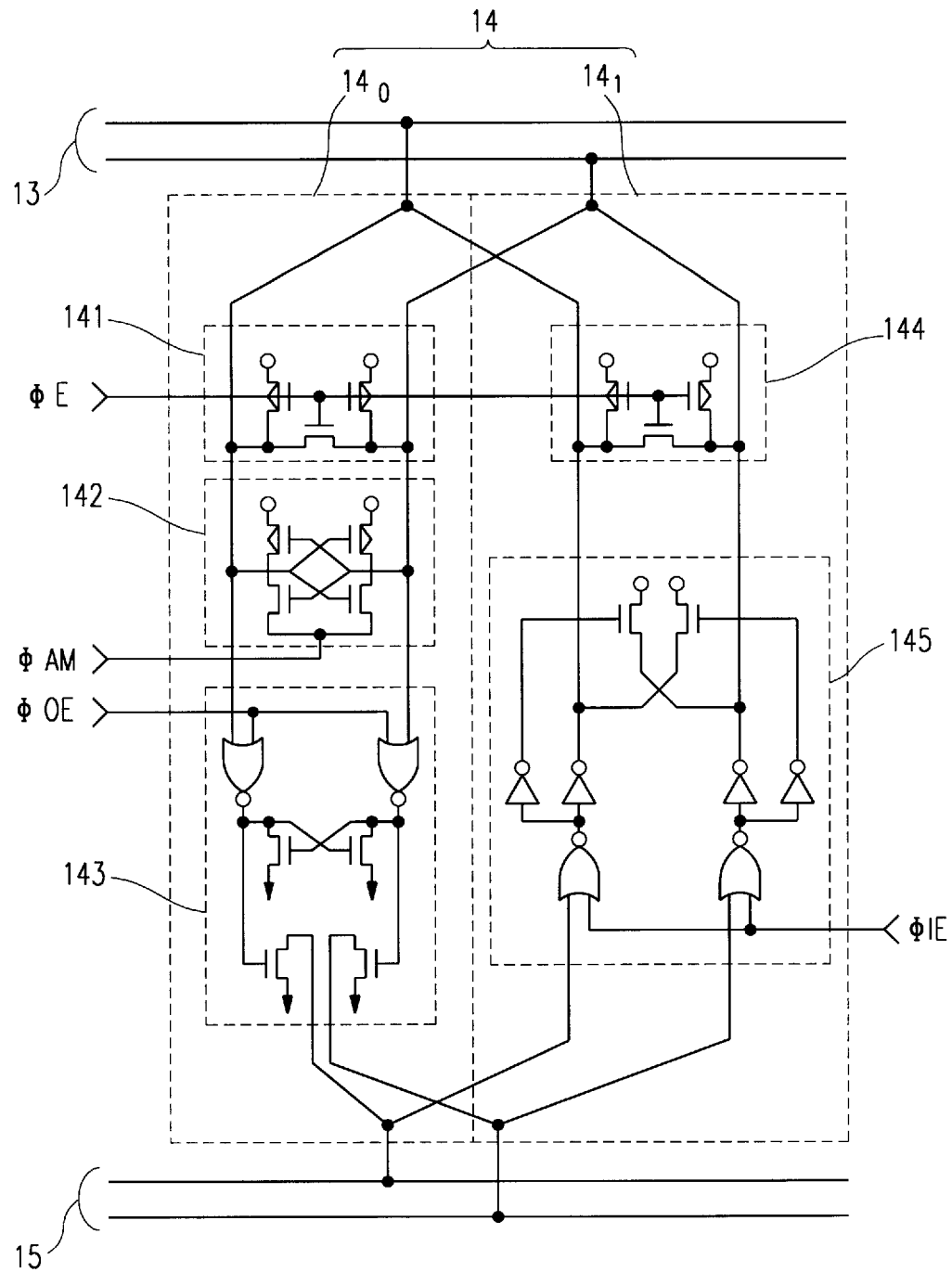
FIG. 10 is a circuit diagram showing it more detail still other essential portions of FIG. 6.

FIG. 10 shows in detail the internal circuit structure of a DQ buffer 14. The DQ buffer 14 is composed of a read unit 14-0 and a write unit 14-1. The read unit 14-0 is composed of an equalization circuit 141 controlled by an equalization signal φE, a sense unit 142 controlled by a signal φAM, and an output drive unit 143 controlled by a signal φOE. The write unit 14-1 is composed of an equalization circuit 144 controlled by the same equalization signal φE and a data receive unit 145 controlled by a signal φIE. Such a multi-stage circuit creates a DQ buffer having high sense sensitivity. When the data bus structure of the first embodiment of the present invention is used, it is possible to arrange the DQ buffer at a position other than the outlet of the DQ line. As a result, it is possible to construct a DRAM containing buffers with high speed and high sensitivity.

Other embodiments of the present invention will now be explained with reference to FIGS. 11 through 16. In these embodiments, the number of buffer circuits can be further reduced through modifications to the arrangement of the newly-provided DP (data bus) lines of the first embodiment. In FIGS. 11 through 16, elements having the same function as elements in FIG. 1 are represented by the same reference numerals and discussion thereof is omitted.

Figure 11:
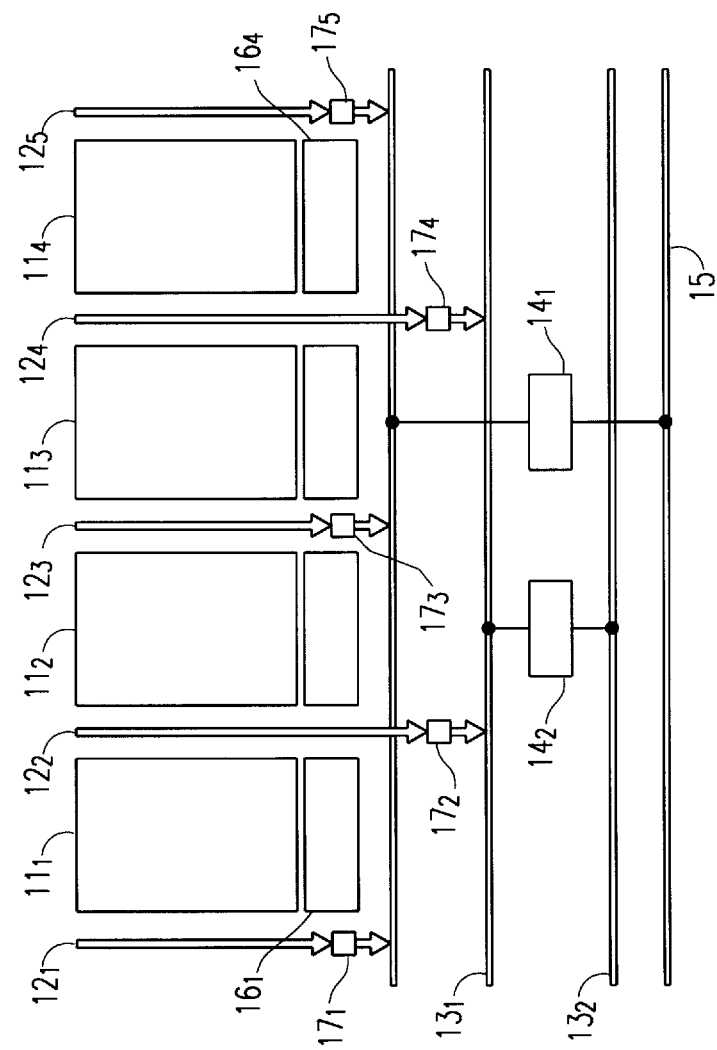
FIG. 11 is a structural view of a circuit showing the essential portions of a second embodiment of the present invention.

FIG. 11 is an outline view of a second embodiment of the present invention showing an arrangement of memory cell arrays, data busses, and buffer circuits and their connecting relationship. This embodiment includes memory cell arrays 11-1, 11-2, 11-3, and 11-4, data busses 12-1, 12-2, 12-3, 12-4, and 12-5 (hereinafter, DQ lines), data busses 13-1 and 13-2 (hereinafter, DP lines), buffer circuits 14-1 and 14-2 (hereinafter, DQ buffers), and data bus 15 (hereinafter, main data bus or RWD line). As in the first embodiment, the DQ lines 12 each consist of four pairs of wirings (eight wirings total) extending in the column direction that are arranged among the memory cell arrays 11. The DQ lines transmit data between the memory cells and the DP lines via pairs of bit lines BL and sense amplifiers, not shown. Adjacent memory cell arrays (not shown) can commonly use the outer DQ lines 12-1 and 12-5.

In the second embodiment, two DP lines 13-1 and 13-2 extend in parallel in the row direction along the ends of four memory cell arrays 11-1 through 11-4. The DP lines 13 each consist of four pairs of wirings (total eight wirings) that transmit data between the DQ lines 12 and the DQ buffers 14. Two DQ buffers 14-1 and 14-2 are arranged corresponding to the two DP lines 13-1 and 13-2. Each DQ buffer 14 is connected to its corresponding DP line 13 and the RWD line 15, which also extends in the row direction. The DQ buffers 14 amplify and transmit data between the DP lines 13 and the RWD line 15. Each of the switch circuits 17 selectively couples one of the DQ lines 12 to its corresponding DP line 13. (If an adjacent memory cell array is provided, a dual-port switch circuit would selectively couple the corresponding outer DQ line to one of the DP lines and an adjacent DP line, not shown.)

The operation of the circuits shown in FIG. 11 will now be explained. When memory cells in the first memory cell array 11-1 are selected, the pair of selected bit lines is coupled to the DQ lines 12-1 and 12-2 via column select transistors, not shown. Additionally, because the memory cell array 11-1 is selected, the switch circuit 17-1 couples the DQ line 12-1 to the DP line 13-1 and the switch circuit 17-2 couples the DQ line 12-2 to the DP line 13-2. As a result, the DQ line 12-1 is coupled to the DQ buffer 14-1 and the DQ line 12-2 is coupled to the DQ buffer 14-2. When memory cells in the second memory cell array 11-2 are selected, the pair of selected bit lines is coupled to the DQ lines 12-2 and 12-3 via the column select transistors, not shown. Because the memory cell array 11-2 is selected, the switch circuit 17-2 couples the DQ line 12-2 to the DP line 13-2 and the switch circuit 17-3 couples the DQ line 12-3 to the DP line 13-1. As a result, the DQ line 12-2 is coupled to the DQ buffer 14-2 and the DQ line 12-3 is coupled to the DQ buffer 14-1. The selection of the third memory cell array 11-3 is analogous to the description for the first memory cell array 11-1, and the selection of the fourth memory cell array 11-4 is analogous to the description for the second memory cell array 11-2.

Thus for all memory cell arrays, in reading data, a very small potential difference between the pair of bit lines is amplified by a sense amplifier, passes through the DQ lines and the DP lines via the column select transistors, is again amplified by the DQ buffers, and is transmitted to the RWD line 15. In writing data, data supplied from the RWD line 15 is amplified by the DQ buffers, passes through the DP lines and the DQ lines, and is transmitted to the pair of selected bit lines via the column select transistors. As a result of the design of the second embodiment of the present invention, only two buffer circuits are required for four memory cell arrays to allow a further reduction in area in comparison with the conventional case wherein the number of the DQ buffers required is one more than the number of memory cell arrays.

Figure 12:
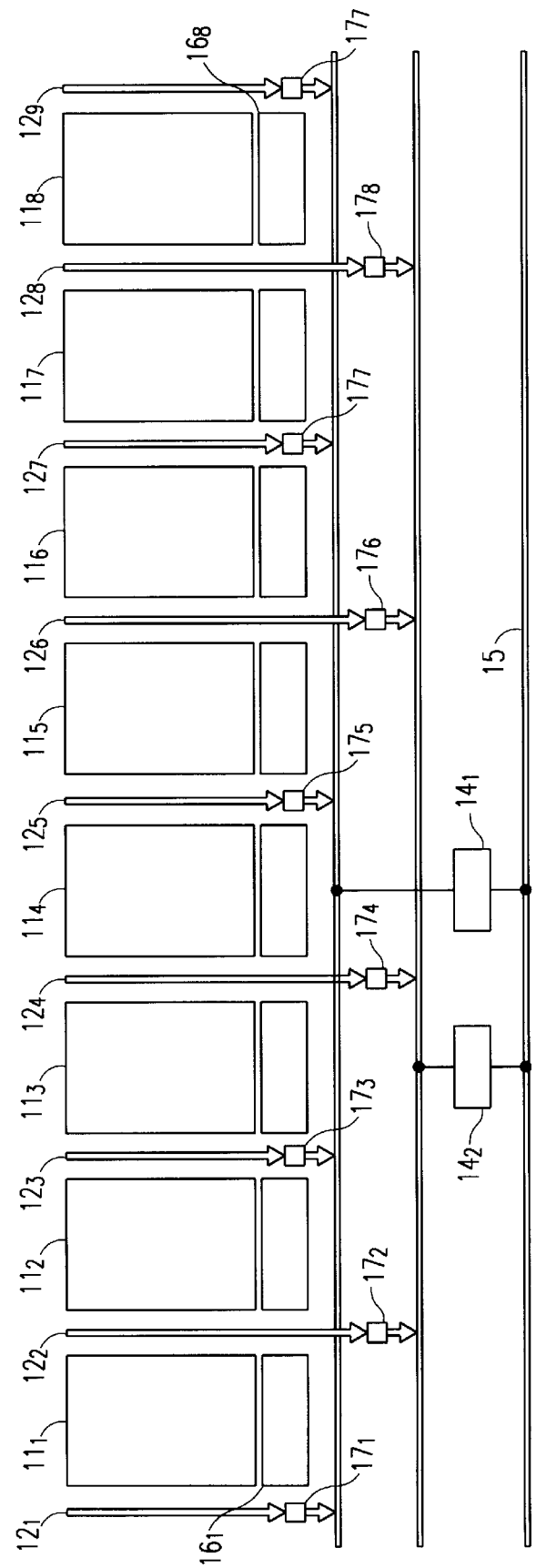
FIG. 12 is a structural view of a circuit showing the essential portions of a third embodiment of the present invention.

FIG. 12 is an outline view of a third embodiment of the present invention. This embodiment includes memory cell arrays 11-1 through 11-8, data busses 12-1 through 12-9 (hereinafter, DQ lines), data busses 13-1 and 13-2 (hereinafter, DP lines), buffer circuits 14-1 and 14-2 (hereinafter, DQ buffers), and data bus 15 (hereinafter, RWD line). As in the previous embodiments, the DQ lines 12 each consist of four pairs of wirings extending in the column direction that are arranged among the memory cell arrays 11. The DQ lines transmit data between the memory cells and the DP lines via pairs of bit lines BL and sense amplifiers, not shown. Adjacent memory cell arrays (not shown) can commonly use the outer DQ lines 12-1 and 12-9.

In the third embodiment, two DP lines 13-1 and 13-2 extend in parallel in the row direction along the ends of eight memory cell arrays 11. As in the second embodiment, the DP lines 13 each consist of four pairs of wirings that transmit data between the DQ lines 12 and the DQ buffers 14. Two DQ buffers 14-1 and 14-2 are arranged corresponding to the two DP lines 13-1 and 13-2. Each DQ buffer 14 is connected to its corresponding DP line 13 and the RWD line 15. The DQ buffers 14 amplify and transmit data between the DP lines 13 and the RWD line 15. Each of the switch circuits 17 selectively couples one of the DQ lines 12 to its corresponding DP line 13.

The operation of the circuits shown in FIG. 12 is similar to the explanation for FIG. 11, except that in the third embodiment two DQ buffers are provided for eight memory cell arrays. In particular, the selection of the first and second memory cell arrays 11-1 and 11-2 in the third embodiment is the same as in the above description for the first and second memory cell arrays 11-1 and 11-2 in the second embodiment. Furthermore, the selection of an odd-numbered memory cell array in the third embodiment is analogous to the above description for the first memory cell array 11-1, and the selection of an even-numbered memory cell array is analogous to the above description for the second memory cell array 11-2. As a result of the design of the third embodiment, only two buffer circuits are required for eight memory cell arrays. This allows an even greater reduction in area in comparison with the conventional case.

Figure 13:
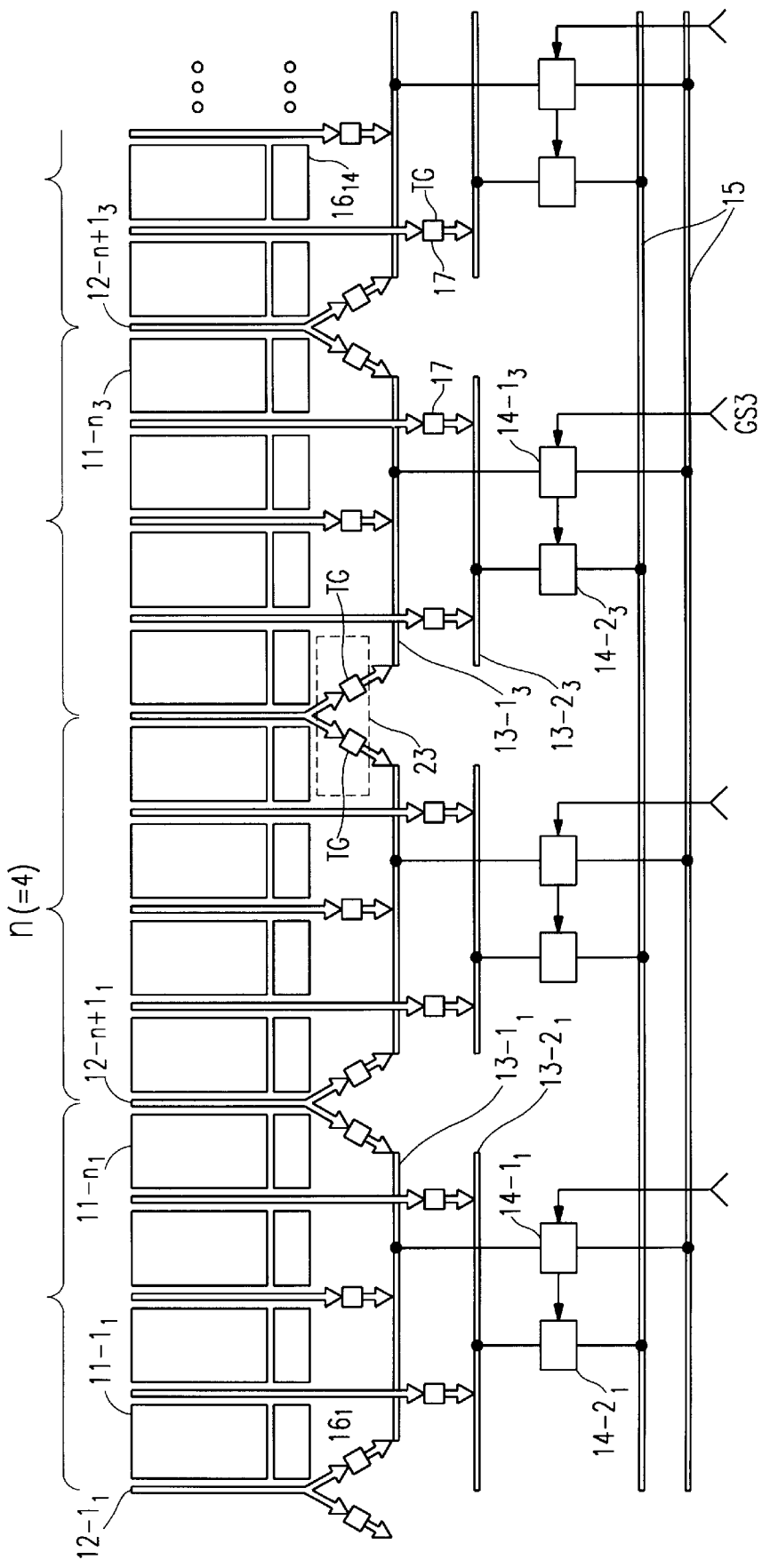
FIG. 13 is a structural view of a circuit showing the essential portions of a fourth embodiment of the present invention.

FIG. 13 is an outline view of a fourth embodiment of the present invention. This embodiment includes memory cell arrays 11-1$_1$ through 11-n$_m$, data busses 12-1$_1$ through 12-(n+1)$_m$ (hereinafter, DQ lines), data busses 13-1$_1$ through 13-2$_m$ (hereinafter, DP lines), buffer circuits 14-1$_1$ through 14-2$_m$ (hereinafter, DQ buffers), and data bus 15 (hereinafter, RWD line). As in previous embodiments, the DQ lines 12 each consist of four pairs of wirings extending in the column direction that are arranged among the memory cell arrays 11. The DQ lines transmit data between the memory cells and the DP lines via pairs of bit lines BL and sense amplifiers, not shown. In the fourth embodiment, m groups of n memory cell arrays are provided, with two DQ buffers being provided for each group of n memory cell arrays. As shown in FIG. 13, the last memory cell array 11-n in one group uses the same (outer) DQ line 12-(n+1) as the first memory cell array 11-1 in the next group.

Two DP lines 13-1 and 13-2 extend in parallel in the row direction along the ends of each group of n memory cell arrays 11. Once again, the DP lines 13 each consist of four pairs of wirings that transmit data between the DQ lines 12 and the DQ buffers 14. Two DQ buffers 14-1 and 14-2 are arranged corresponding to every two DP lines 13-1 and 13-2. Each DQ buffer 14 is connected to its corresponding DP line 13 and the RWD line 15. The DQ buffers 14 amplify and transmit data between the DP lines 13 and the RWD line 15. The switch circuits 23 selectively couple the DQ lines 12 to the DP lines 13. A dual-port switch circuit 23 is used with each of the outer DQ lines 12 to selectively couple the outer DQ line 12 to one of the DP lines in each of the two adjacent groups. Each of the switch circuits has switch elements for connecting and disconnecting corresponding wirings of the data busses. Further, each of the switch elements in each switch circuit that is connected to one of the first data busses shared by adjacent memory blocks has two transmit gates TG that each selectively couple the corresponding first data bus to the third data bus of one of the two adjacent memory blocks. Each of the switch elements in each of the remaining switch circuits has one transmit gate.

The operation of the circuits shown in FIG. 13 is similar to the explanation for FIGS. 11 and 12, except that in the fourth embodiment two DQ buffers are provided for a group of n memory cell arrays. The selection of an odd-numbered memory cell array in the fourth embodiment is analogous to the above description for the first memory cell array 11-1, and the selection of an even-numbered memory cell array is analogous to the above description for the second memory cell array 11-2. However, in the fourth embodiment, when a memory cell array is selected, that number (1 through n) memory cell array is selected in each of the m groups of arrays. To select the group containing the selected memory cell array 11, a group select signal GS is sent to only one set of DQ buffers 14-1 and 14-2 to couple the selected memory cell array to the RWD line 15. While the number of memory cell arrays in each group (n) could be any number, in preferred embodiments the number is a power of 2 (i.e., n=2$^k$, where k≧1). As a result of the design of the fourth embodiment, only two buffer circuits are required for every n memory cell arrays to allow a considerable reduction in area in comparison with the conventional case.

Figure 14:
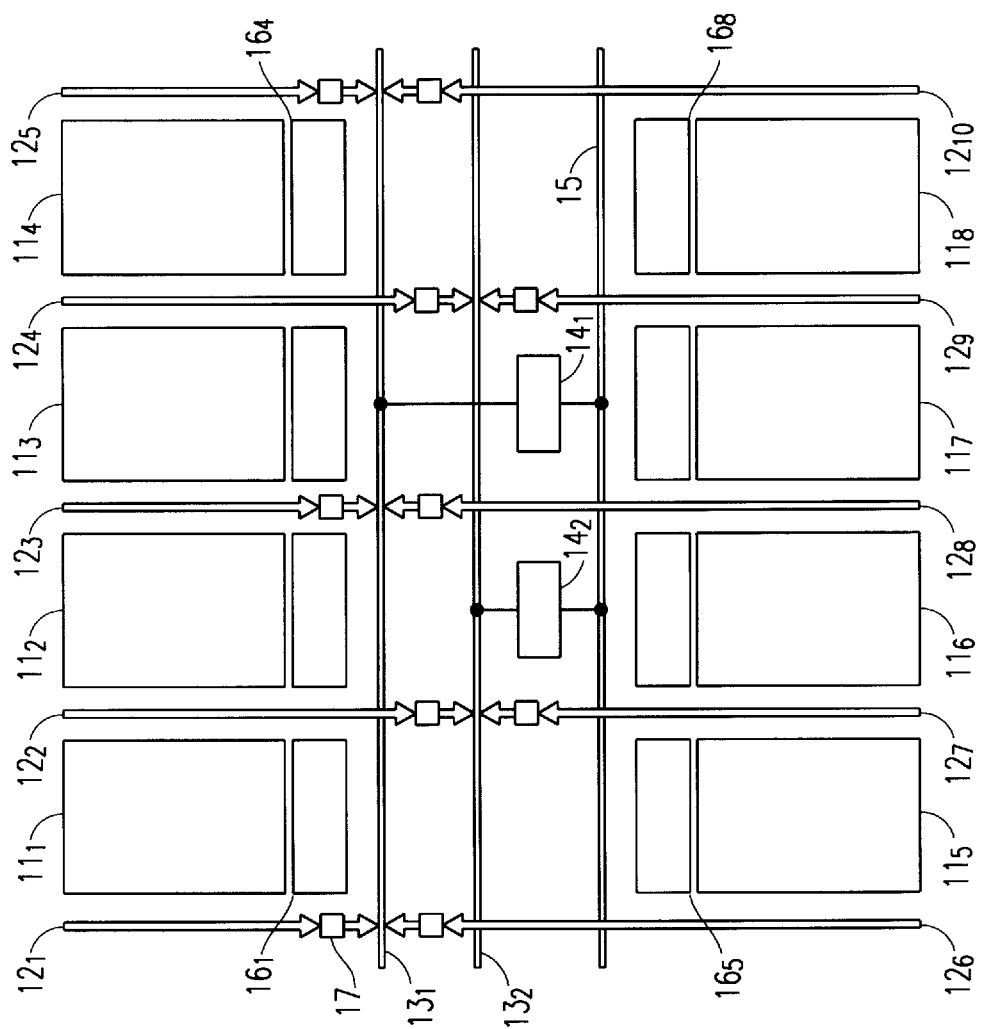
FIG. 14 is a structural view of a circuit showing the essential portions of a fifth embodiment of the present invention.

FIG. 14 is an outline view of a fifth embodiment of the present invention. This embodiment includes memory cell arrays 11-1 through 11-8, data busses 12-1 through 12-10 (hereinafter, DQ lines), data busses 13-1 and 13-2 (hereinafter, DP lines), buffer circuits 14-1 and 14-2 (hereinafter, DQ buffers), and data bus 15 (hereinafter, RWD line). As in previous embodiments, the DQ lines 12 each consist of four pairs of wirings extending in the column direction that are arranged among the memory cell arrays 11. The DQ lines transmit data between the memory cells and the DP lines via pairs of bit lines BL and sense amplifiers, not shown. Adjacent memory cell arrays (not shown) can commonly use the outer DQ lines 12-1, 12-5, 12-6, and 12-10.

In the fifth embodiment, the memory cell arrays 11 are divided into a top half and a bottom half of memory cell arrays. Two DP lines 13-1 and 13-2, which are shared by the top and bottom halves of memory cell arrays, extend in parallel in the row direction along the ends of the memory cell arrays 11 of the top half. As in previous embodiments, the DP lines 13 each consist of four pairs of wirings that transmit data between the DQ lines 12 and the DQ buffers 14. Two DQ buffers 14-1 and 14-2, which respectively correspond to the two DP lines 13-1 and 13-2, are connected between the DP lines 13 and the RWD line 15. The DQ buffers 14 amplify and transmit data between the DP lines 13 and the RWD line 15. Each of the switch circuits 17 selectively couples a top DQ line 12 and a bottom DQ line 12 to their corresponding DP line 13. (If adjacent memory cell arrays are provided, dual-port switch circuits would selectively couple the corresponding top and bottom outer DQ lines 12 to one of the DP lines 13 and an adjacent DP line, not shown.)

The operation of the circuits shown in FIG. 14 is similar to the explanation for FIG. 11, except that in the fifth embodiment there are top and bottom memory cell arrays. Generally, the selection of an odd-numbered memory cell array in the fifth embodiment is analogous to the above description for the first memory cell array 11-1, and the selection of an even-numbered memory cell array is analogous to the above description for the second memory cell array 11-2. Additionally, in the fifth embodiment, the switch circuits 17 also operate to select either a top or a bottom DQ line 12 for coupling to the corresponding DP line 13. Just as in the previously-described embodiments, in operation only one DQ line is coupled to each of the two DP lines (for ultimate coupling to one of the DQ buffers 14). As a result of the design of the fifth embodiment, the required number of buffer circuits is further halved (as compared with the second embodiment) to allow an even greater reduction in area.

Figure 15:
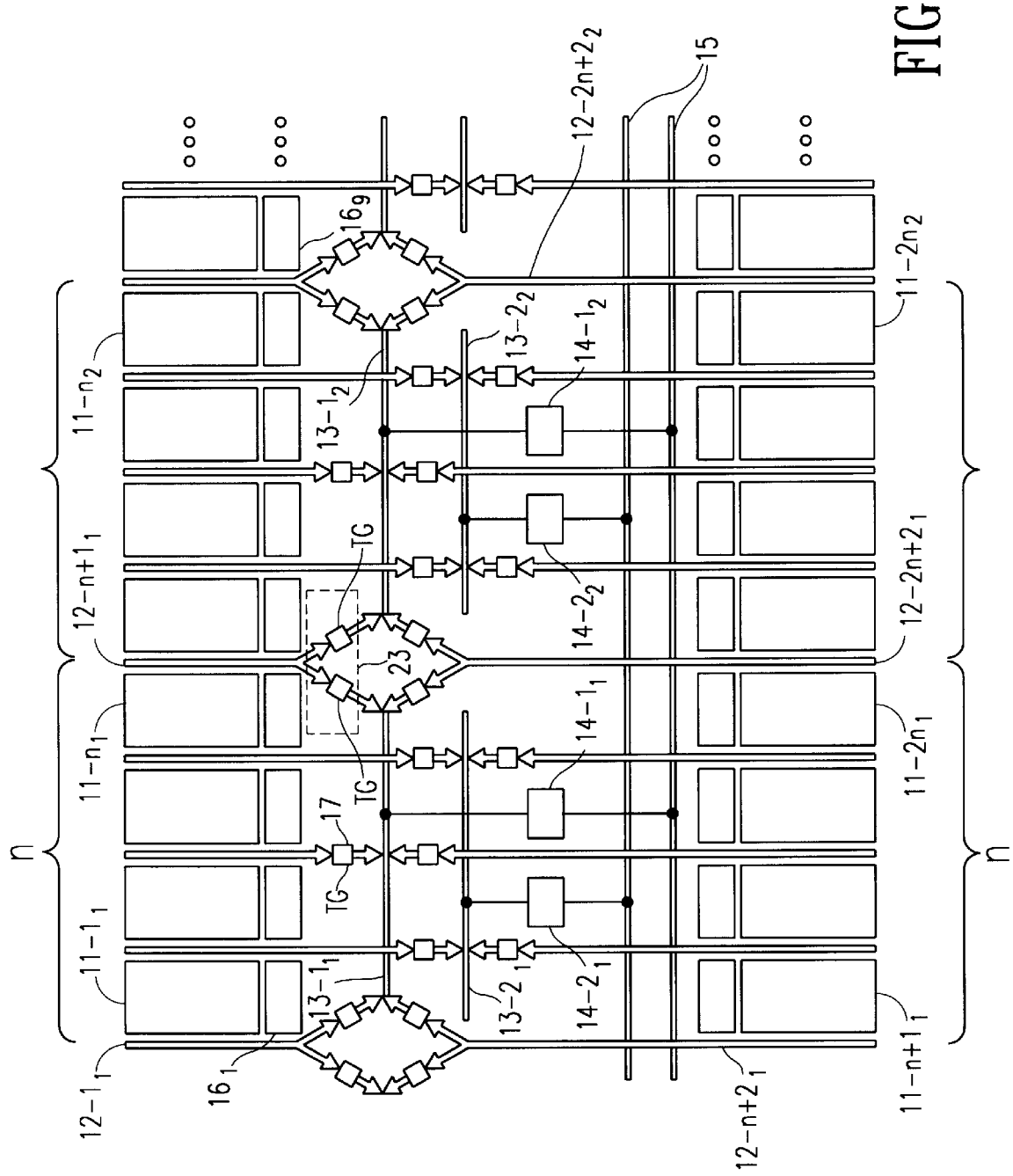
FIG. 15 is a structural view of a circuit showing the essential portions of a sixth embodiment of the present invention.

FIG. 15 is an outline view of a sixth embodiment of the present invention. This embodiment includes memory cell arrays $11\text{-}1_1$ through $11\text{-}(2n)_m$, data busses $12\text{-}1_1$ through $12\text{-}(2n+2)_m$ (hereinafter, DQ lines), data busses $13\text{-}1_1$ through $13\text{-}2_m$ (hereinafter, DP lines), buffer circuits $14\text{-}1_1$ through $14\text{-}2_m$ (hereinafter, DQ buffers), and data bus 15 (hereinafter, RWD line). As in previous embodiments, the DQ lines 12 each consist of four pairs of wirings extending in the column direction that are arranged among the memory cell arrays 11. The DQ lines transmit data between the memory cells and the DP lines via pairs of bit lines BL and sense amplifiers, not shown. In the sixth embodiment, m groups of (2n) memory cell arrays are provided, with each group of (2n) memory cell arrays 11 being further divided into a top half and a bottom half of memory cell arrays. Two DQ buffers are provided for each group of (2n) memory cell arrays. As shown in FIG. 15, the last top memory cell array 11-n in one group uses the same (outer) DQ line 12-(n+1) as the first top memory cell array 11-1 in the next group, and the last bottom memory cell array 11-2n in one group uses the same (outer) DQ line 12-(2n+2) as the first bottom memory cell array 11-(n+1) in the next group.

Two DP lines 13-1 and 13-2, which are shared by the top and bottom memory cell arrays in a group, extend in parallel in the row direction along the ends of each group's top half of memory cell arrays. Again, the DP lines 13 each consist of four pairs of wirings that transmit data between the DQ lines 12 and the DQ buffers 14. Two DQ buffers 14-1 and 14-2 are arranged corresponding to every two DP lines 13-1 and 13-2. Each DQ buffer 14 is connected to its corresponding DP line 13 and the RWD line 15. The DQ buffers 14 amplify and transmit data between the DP lines 13 and the RWD line 15. The switch circuits 17 and 23 selectively couple top and bottom DQ lines 12 to the DP lines 13. A dual-port switch circuit 23 is used with the outer DQ lines 12 to selectively couple a top and a bottom outer DQ line 12 to one of the DP lines in each of the two adjacent groups, as shown in FIG. 15. Each of the upper switch circuits and each of the lower switch circuits have switch elements for connecting and disconnecting corresponding wirings of the data busses. Further, each of the switch elements in each upper switch circuit that is connected to one of the upper data busses shared by adjacent memory blocks has two transmit gates TG that each selectively couple the corresponding upper data bus to the second data bus of one of the two adjacent memory blocks. Similarly, each of the switch elements in each lower switch circuit that is connected to one of the lower data busses shared by adjacent memory blocks has two transmit gates TG that each selectively couple the corresponding lower data bus to the second data bus of one of the two adjacent memory blocks. Each of the switch elements in each of the remaining upper switch circuits and each of the switch elements in each of the remaining lower switch circuits have one transmit gate.

The operation of the circuits shown in FIG. 15 is similar to the explanation for FIG. 13, except that in the sixth embodiment each group is divided into top and bottom memory cell arrays. Again, the selection of an odd-numbered memory cell array in the sixth embodiment is analogous to the above description for the first memory cell array 11-1, and the selection of an even-numbered memory cell array is analogous to the above description for the second memory cell array 11-2. Additionally, in the sixth embodiment, the switch circuits 17 also operate to select either a top or a bottom DQ line 12 for coupling to the corresponding DP line 13. In operation, only one DQ line is coupled to each of the two DP lines for a group (for ultimate coupling to one of the DQ buffers 14 for the group).

Further, as in the fourth embodiment, when a memory cell array is selected, that number (1 through 2n) memory cell array is selected in each of the m groups of arrays. To select the group containing the selected memory cell array 11, a group select signal GS is sent to only one set of DQ buffers 14-1 and 14-2 to couple the selected memory cell array to the RWD line 15. While the number of memory cell arrays in each group (2n) could be any number, in preferred embodiments the number is a power of 2 (i.e., $n=2^k$, where $k \geq 1$). As a result of the design of the sixth embodiment, the required number of buffer circuits is further halved (as compared with the third embodiment). Specifically, only two buffer circuits are required for every 2n memory cell arrays to allow a considerable reduction in area in comparison with the conventional case.

Figure 16:
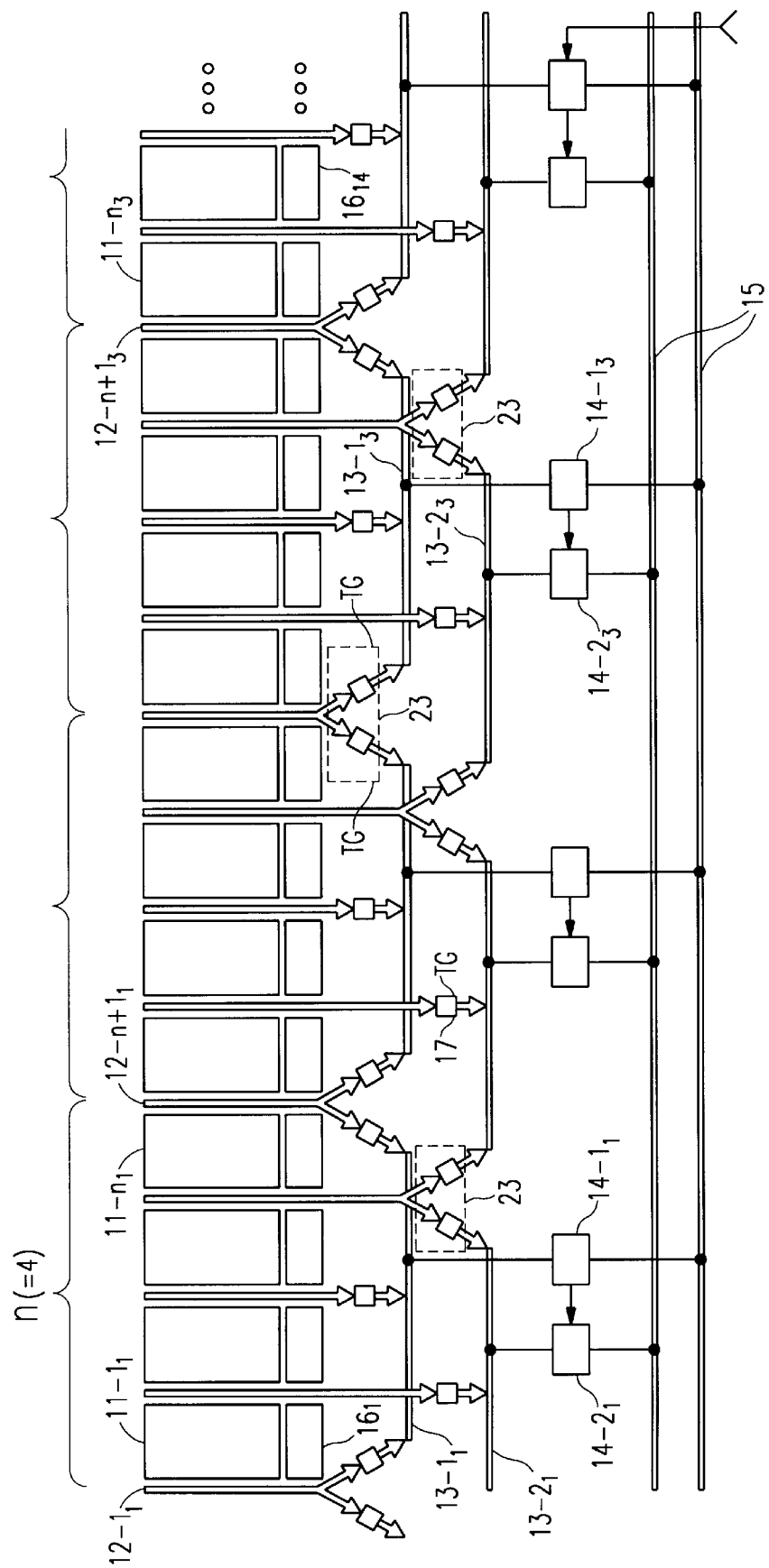
FIG. 16 is a structural view of a circuit showing the essential portions of a seventh embodiment of the present invention.
Figure 17:
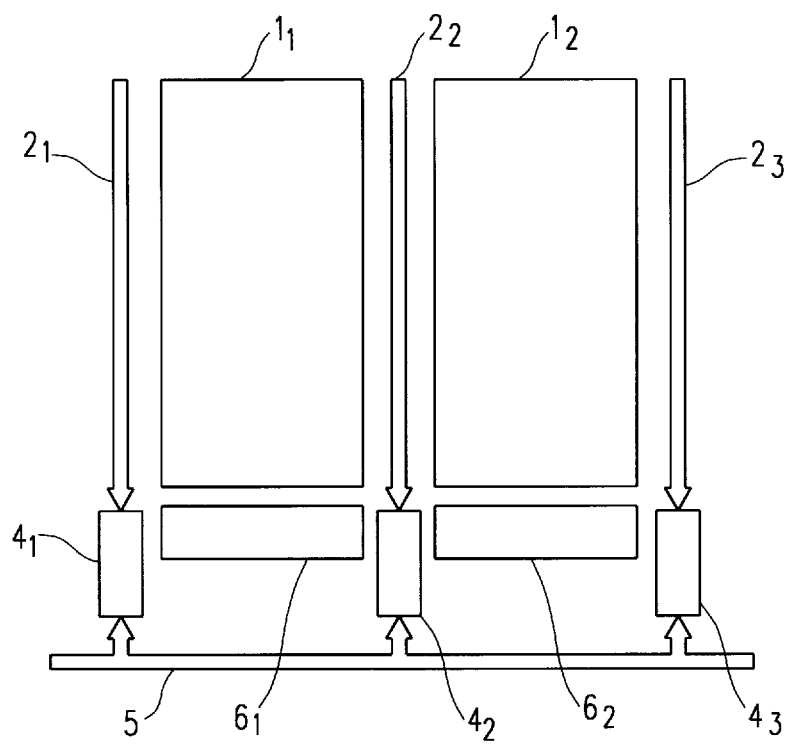
FIG. 17 is a structural view of a circuit showing the arrangement and connecting relationship of data busses and buffer circuits in a conventional semiconductor memory.

FIG. 16 is an outline view of a seventh embodiment of the present invention. This embodiment includes memory cell arrays $11\text{-}1_1$ through $11\text{-}n_m$, data busses $12\text{-}1_1$ through $12\text{-}(n+1)_m$ (hereinafter, DQ lines), data busses $13\text{-}1_1$ through $13\text{-}2_m$ (hereinafter, DP lines), buffer circuits $14\text{-}1_1$ through $14\text{-}2_m$ (hereinafter, DQ buffers), and data bus 15 (hereinafter, RWD line). The seventh embodiments is nearly identical to the fourth embodiment so a general description of the circuit of FIG. 16 is omitted. The modification made in this embodiment is that the DP lines 13-1 and 13-2, which extend in parallel in the row direction along the ends of the memory cell arrays 11, are placed in a staggered arrangement.

As shown in FIG. 16, a first DP line 13-1 extends along the ends of the memory cell arrays in a group ($11\text{-}1_2$ through 11-$n_2$), while a second DP line 13-2 extends along the end of the last memory cell array in the previous group (11-$n_1$) and all but the last memory cell array in the group (11-$1_2$ through 11-(n−1)$_2$). Therefore, a dual-port switch circuit 23 must also be used with the next to last DQ line 12-n in each group to selectively couple the DQ line 12-n to the second DP lines in each of the two adjacent groups. For example, a dual-port switch circuit 23-$n_2$ is required to selectively couple the next to last DQ line 12-$n_2$ to second DP lines 13-$2_2$ and 13-$2_3$ from two adjacent groups. Each of the upper switch circuits and each of the lower switch circuits have switch elements for connecting and disconnecting corresponding wirings of the data busses. Further, each of the switch elements in each upper switch circuit that is connected to one of the upper data busses shared by adjacent memory blocks has two transmit gates TG that each selectively couple the corresponding upper data bus to the second data bus of one of the two adjacent memory blocks, and each of the switch elements in another upper switch circuit in each memory block has two transmit gates TG that each selectively couple the corresponding upper data bus to the first data bus of one of the two adjacent groups of memory cell arrays. Similarly, each of the switch elements in each lower switch circuit that is connected to one of the lower data busses shared by adjacent memory blocks has two transmit gates TG that each selectively couple the corresponding lower data bus to the second data bus of one of the two adjacent memory blocks, and each of the switch elements in another lower switch circuit in each memory block has two transmit gates TG that each selectively couple the corresponding lower data bus to the first data bus of one of the two adjacent groups of memory cell arrays. Each of the switch elements in each of the remaining switch circuits has one transmit gate. Additionally, in this embodiment two DQ buffers 14-1 and 14-2 are arranged corresponding to every two DP lines 13-1 and 13-2 so only two buffer circuits are required for every n memory cell arrays. This allows a reduction in area in comparison with the conventional case.

The embodiments of the present invention described above relate to the use of data busses containing four pairs of wirings. However, any number of wirings could be used depending on the desired bus width or word length. The main data bus could also consist of a single data bus or a plurality of data busses. Additionally, the switch circuits could be realized by any coupling circuit and the data buffers could be realized by any type of buffer circuit. Furthermore, the staggered DP line arrangement of the seventh embodiment could obviously be adapted to be used in any of the other described embodiments.

As previously explained, the present invention provides a dynamic-type semiconductor memory wherein the number of buffer circuits is less than or equal to the number of memory cell arrays and control is facilitated while chip area is reduced.

While there has been illustrated and described what are presently considered to be the preferred embodiments of the present invention, it will be understood by those skilled in the art that various other modifications may be made, and equivalents may be substituted, without departing from the true scope of the invention. Additionally, many modifications may be made to adapt a particular situation or material to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A semiconductor memory, comprising:
   a first, a second, and a third data bus extending in a first direction;
   a first memory cell array having a plurality of memory cells arranged in a matrix, the first memory cell array arranged between the first and the second data busses;
   a second memory cell array having a plurality of memory cells arranged in a matrix, the second memory cell array arranged between the second and the third data busses;
   a fourth data bus extending in a second direction that is perpendicular to the first direction, the fourth data bus arranged along an end of the first and second memory cell arrays; and
   a first data buffer circuit for amplifying data, the first data buffer circuit being connected between the fourth data bus and a main data bus.

2. The semiconductor memory as defined in claim 1, further comprising:
   a first row decode circuit for selecting rows of the first memory cell array, the first row decode circuit being arranged between the first memory cell array and the fourth data bus; and
   a second row decode circuit for selecting rows of the second memory cell array, the second row decode circuit being arranged between the second memory cell array and the fourth data bus.

3. The semiconductor memory as defined in claim 1, further comprising:
   a first switch circuit for selectively coupling the first data bus to the fourth data bus; and
   a second switch circuit for selectively coupling the third data bus to the fourth data bus,
   wherein either:
     the first switch circuit couples the first data bus to the fourth data bus to select the first memory cell array, or
     the second switch circuit couples the third data bus to the fourth data bus to select the second memory cell array.

4. The semiconductor memory as defined in claim 3, wherein each of the switch circuits includes at least one transmit gate, each transmit gate being formed by an NMOS transistor and a PMOS transistor connected in parallel.

5. The semiconductor memory as defined in claim 1, further comprising:
   a fifth data bus extending in the second direction and arranged adjacent to the fourth data bus; and
   a second data buffer circuit for amplifying data, the second data buffer circuit being connected between the fifth data bus and the main data bus.

6. The semiconductor memory as defined in claim 5, further comprising:
   a first switch circuit for selectively coupling the first data bus to the fourth data bus;
   a second switch circuit for selectively coupling the second data bus to the fifth data bus; and
   a third switch circuit for selectively coupling the third data bus to the fourth data bus,
   wherein either:
     the first switch circuit couples the first data bus to the fourth data bus, and the second switch circuit couples the second data bus to the fifth data bus, to select the first memory cell array, or the third switch circuit couples the third data bus to the fourth data bus, and the second switch circuit couples the second data bus to the fifth data bus, to select the second memory cell array.

7. The semiconductor memory as defined in claim 6,
wherein each of the first to the fifth data busses has W wirings (W≧1),
each of the first to the third switch circuits has W switch elements for connecting and disconnecting corresponding wirings of the data busses, and
each of the switch elements includes at least one transmit gate, each transmit gate being formed by an NMOS transistor and a PMOS transistor connected in parallel.

8. The semiconductor memory as defined in claim 7, wherein W is eight.

9. The semiconductor memory as defined in claim 5, further comprising:
a sixth and a seventh data bus extending in the first direction;
a third memory cell array having a plurality of memory cells arranged in a matrix, the third memory cell array arranged between the third and the sixth data busses; and
a fourth memory cell array having a plurality of memory cells arranged in a matrix, the fourth memory cell array arranged between the sixth and the seventh data busses,
wherein the fourth and the fifth data busses further extend in parallel along an end of the third and the fourth memory cell arrays, and
the first data bus is selectively coupled to the fourth data bus, the second data bus is selectively coupled to the fifth data bus, the third data bus is selectively coupled to the fourth data bus, the sixth data bus is selectively coupled to the fifth data bus, and the seventh data bus is selectively coupled to the fourth data bus.

10. The semiconductor memory as defined in claim 9, further comprising:
a first switch circuit for selectively coupling the first data bus to the fourth data bus;
a second switch circuit for selectively coupling the second data bus to the fifth data bus;
a third switch circuit for selectively coupling the third data bus to the fourth data bus;
a fourth switch circuit for selectively coupling the sixth data bus to the fifth data bus; and
a fifth switch circuit for selectively coupling the seventh data bus to the fourth data bus,
wherein either:
the first switch circuit couples the first data bus to the fourth data bus, and the second switch circuit couples the second data bus to the fifth data bus, to select the first memory cell array, or
the third switch circuit couples the third data bus to the fourth data bus, and the second switch circuit couples the second data bus to the fifth data bus, to select the second memory cell array, or
the third switch circuit couples the third data bus to the fourth data bus, and the fourth switch circuit couples the sixth data bus to the fifth data bus, to select the third memory cell array, or
the fifth switch circuit couples the seventh data bus to the fourth data bus, and the fourth switch circuit couples the sixth data bus to the fifth data bus, to select the fourth memory cell array.

11. The semiconductor memory as defined in claim 10,
wherein each of the first to the seventh data busses has W wirings (W≧1), and
each of the first to the fifth switch circuits has W switch elements for connecting and disconnecting corresponding wirings of the data busses, each of the switch elements having at least one transmit gate.

12. The semiconductor memory as defined in claim 9, further comprising:
an eighth, a ninth, a tenth, and an eleventh data bus extending in the first direction;
a fifth memory cell array having a plurality of memory cells arranged in a matrix, the fifth memory cell array arranged between the seventh and the eighth data busses; and
a sixth memory cell array having a plurality of memory cells arranged in a matrix, the sixth memory cell array arranged between the eighth and the ninth data busses,
a seventh memory cell array having a plurality of memory cells arranged in a matrix, the seventh memory cell array arranged between the ninth and the tenth data busses; and
an eighth memory cell array having a plurality of memory cells arranged in a matrix, the eighth memory cell array arranged between the tenth and the eleventh data busses,
wherein the fourth and the fifth data busses further extend in parallel along an end of the fifth, the sixth, the seventh, and the eighth memory cell arrays, and
the eighth data bus is selectively coupled to the fifth data bus, the ninth data bus is selectively coupled to the fourth data bus, the tenth data bus is selectively coupled to the fifth data bus, and the eleventh data bus is selectively coupled to the fourth data bus.

13. The semiconductor memory as defined in claim 12, further comprising:
a first switch circuit for selectively coupling the first data bus to the fourth data bus;
a second switch circuit for selectively coupling the second data bus to the fifth data bus;
a third switch circuit for selectively coupling the third data bus to the fourth data bus;
a fourth switch circuit for selectively coupling the sixth data bus to the fifth data bus;
a fifth switch circuit for selectively coupling the seventh data bus to the fourth data bus;
a sixth switch circuit for selectively coupling the eighth data bus to the fifth data bus;
a seventh switch circuit for selectively coupling the ninth data bus to the fourth data bus;
an eighth switch circuit for selectively coupling the tenth data bus to the fifth data bus; and
a ninth switch circuit for selectively coupling the eleventh data bus to the fourth data bus,
wherein either:
the first switch circuit couples the first data bus to the fourth data bus, and the second switch circuit couples the second data bus to the fifth data bus, to select the first memory cell array, or
the third switch circuit couples the third data bus to the fourth data bus, and the second switch circuit couples the second data bus to the fifth data bus, to select the second memory cell array, or
the third switch circuit couples the third data bus to the fourth data bus, and the fourth switch circuit couples the sixth data bus to the fifth data bus, to select the third memory cell array, or the fifth switch circuit couples the seventh data bus to the fourth data bus, and the fourth switch circuit couples the sixth data bus to the fifth data bus, to select the fourth memory cell array, or the fifth switch circuit couples the seventh data bus to the fourth data bus, and the sixth switch circuit couples the eighth data bus to the fifth data bus, to select the fifth memory cell array, or the seventh switch circuit couples the ninth data bus to the fourth data bus, and the sixth switch circuit couples the eighth data bus to the fifth data bus, to select the sixth memory cell array, or the seventh switch circuit couples the ninth data bus to the fourth data bus, and the eighth switch circuit couples the tenth data bus to the fifth data bus, to select the seventh memory cell array, or the ninth switch circuit couples the eleventh data bus to the fourth data bus, and the eighth switch circuit couples the tenth data bus to the fifth data bus, to select the eighth memory cell array.

14. The semiconductor memory as defined in claim 13, wherein each of the first to the eleventh data busses has W wirings (W≧1), and each of the first to the ninth switch circuits has W switch elements for connecting and disconnecting corresponding wirings of the data busses, each of the switch elements having at least one transmit gate.

15. A memory block of the type used in a semiconductor memory, comprising:

N memory cell arrays, each memory cell array being selectively activated;

N+1 first data busses arranged in parallel;

a second data bus arranged perpendicularly to the first data busses; and

N+1 switch circuits, each of the switch circuits being connected to one of the N+1 first data busses, wherein the first data busses are arranged alternately with the memory cell arrays, and N/2 of the N+1 switch circuits each operate to selectively couple the corresponding first data bus to the second data bus.

16. The memory block as defined in claim 15, further comprising a first buffer circuit connected to the second data bus.

17. The memory block as defined in claim 16, further comprising N+1 groups of sense amplifier circuits, each group of sense amplifier circuits corresponding to and arranged with one of the N+1 first data busses.

18. The memory block as defined in claim 16, further comprising N row decode circuits, each of the row decode circuits corresponding to one of the N memory cell arrays and being arranged between the corresponding memory cell array and the second data bus.

19. The memory block as defined in claim 16, further comprising a main data bus connected to the first buffer circuit.

20. The memory block as defined in claim 19, further comprising:

a third data bus arranged in parallel with the second data bus; and a second buffer circuit connected between the main data bus and the third data bus, wherein ((N/2)+1) of the N+1 switch circuits each operate to selectively couple the corresponding first data bus to the third data bus.

21. The memory block as defined in claim 20, wherein each of the first data busses has W wirings (W≧1), the second data bus and the third data bus each have W wirings, and each of the switch circuits has W switch elements for connecting and disconnecting corresponding wirings of the data busses, each of the switch elements having at least one transmit gate.

22. The memory block as defined in claim 20, wherein N is four.

23. The memory block as defined in claim 20, wherein N is eight.

24. The memory block as defined in claim 20, wherein k is an integer greater than or equal to one, and N satisfies the equation $N=2^k$.

25. A semiconductor memory, comprising:

M memory blocks, each memory block including:

N memory cell arrays, each memory cell array being selectively activated;

N+1 first data busses arranged in parallel, the first data busses being arranged alternately with the memory cell arrays;

a second data bus arranged perpendicularly to the first data busses;

a third data bus arranged in parallel with the second data bus;

N+1 switch circuits, each of the switch circuits being connected to one of the first data busses such that N/2 of the N+1 switch circuits each operate to selectively couple the corresponding first data bus to the second data bus and ((N/2)+1) of the N+1 switch circuits each operate to selectively couple the corresponding first data bus to the third data bus;

a first buffer circuit connected to the second data bus; and a second buffer circuit connected to the third data bus; and a main data bus, a portion of the main data bus being connected to the M first buffer circuits and another portion of the main data bus being connected to the M second buffer circuits, wherein adjacent memory blocks share a first data bus so that in every memory block except the first memory block, the number one first data bus for one memory block is the same as the number N+1 first data bus for the next memory block.

26. The semiconductor memory as defined in claim 25, wherein data from the first and the second buffer circuits of one of the M memory blocks is selectively coupled to the main data bus.

27. The semiconductor memory as defined in claim 26, wherein each of the M memory blocks further includes N+1 groups of sense amplifier circuits, each group of sense amplifier circuits corresponding to and arranged with one of the N+1 first data busses, thereby allowing adjacent memory blocks to also share a group of sense amplifier circuits.

28. The semiconductor memory as defined in claim 26, wherein each of the M memory blocks further includes N row decode circuits, each of the row decode circuits corresponding to one of the N memory cell arrays in the memory block and being arranged between the corresponding memory cell array and the second data bus of the memory block.

29. The semiconductor memory as defined in claim 26, wherein each of the first data busses has W wirings (W≧1), each of the second data busses and each of the third data busses have W wirings, and each of the switch circuits has W switch elements for connecting and disconnecting corresponding wirings of the data busses, each of the switch elements having at least one transmit gate.

30. The semiconductor memory as defined in claim 29, wherein each of the W switch elements in each switch circuit that is connected to one of the first data busses shared by adjacent memory blocks has two transmit gates, each of the two transmit gates selectively coupling the corresponding first data bus to the third data bus of one of the two adjacent memory blocks, and each of the switch elements in each of the remaining switch circuits has one transmit gate.

31. The semiconductor memory as defined in claim 29, wherein each of the W switch elements in each switch circuit that is connected to one of the first data busses shared by adjacent memory blocks has two transmit gates, each of the two transmit gates selectively coupling the corresponding first data bus to the third data bus of one of the two adjacent memory blocks, each of the W switch elements in another switch circuit in each memory block has two transmit gates, each of the two transmit gates selectively coupling the corresponding first data bus to the second data bus of one of the two adjacent groups of memory cell arrays, and each of the switch elements in each of the remaining switch circuits has one transmit gate.

32. The semiconductor memory as defined in claim 26, wherein N is four.

33. The semiconductor memory as defined in claim 26, wherein N is eight.

34. The semiconductor memory as defined in claim 26, wherein k is an integer greater than or equal to one, and N satisfies the equation $N=2^k$.

35. A semiconductor memory, comprising:

a first, a second, and a third upper data bus extending in a first direction;

a first upper memory cell array having a plurality of memory cells arranged in a matrix, the first upper memory cell array arranged between the first upper data bus and the second upper data bus;

a second upper memory cell array having a plurality of memory cells arranged in a matrix, the second upper memory cell array arranged between the second upper data bus and the third upper data bus;

a first intermediate data bus extending in a second direction that is perpendicular to the first direction, the intermediate data bus arranged along an end of the first and second upper memory cell arrays;

a first data buffer circuit for amplifying data, the first data buffer circuit being connected to the first intermediate data bus;

a main data bus connected to the first data buffer circuit;

a first, a second, and a third lower data bus extending in a first direction;

a first lower memory cell array having a plurality of memory cells arranged in a matrix, the first lower memory cell array arranged between the first lower data bus and the second lower data bus; and a second lower memory cell array having a plurality of memory cells arranged in a matrix, the second lower memory cell array arranged between the second lower data bus and the third lower data bus.

36. The semiconductor memory as defined in claim 35, further comprising:

a first upper row decode circuit for selecting rows of the first upper memory cell array, the first upper row decode circuit being arranged between the first upper memory cell array and the first intermediate data bus;

a second upper row decode circuit for selecting rows of the second upper memory cell array, the second upper row decode circuit being arranged between the second upper memory cell array and the first intermediate data bus;

a first lower row decode circuit for selecting rows of the first lower memory cell array, the first lower row decode circuit being arranged between the first lower memory cell array and the first intermediate data bus; and a second lower row decode circuit for selecting rows of the second lower memory cell array, the second lower row decode circuit being arranged between the second lower memory cell array and the first intermediate data bus.

37. The semiconductor memory as defined in claim 35, further comprising:

a first upper switch circuit for selectively coupling the first upper data bus to the first intermediate data bus;

a second upper switch circuit for selectively coupling the third upper data bus to the first intermediate data bus;

a first lower switch circuit for selectively coupling the first lower data bus to the first intermediate data bus; and a second lower switch circuit for selectively coupling the third lower data bus to the first intermediate data bus, wherein either:

the first upper switch circuit couples the first upper data bus to the first intermediate data bus to select the first upper memory cell array, or the second upper switch circuit couples the third upper data bus to the first intermediate data bus to select the second upper memory cell array, or the first lower switch circuit couples the first lower data bus to the first intermediate data bus to select the first lower memory cell array, or the second lower switch circuit couples the third lower data bus to the first intermediate data bus to select the second lower memory cell array.

38. The semiconductor memory as defined in claim 37, wherein each of the upper and lower switch circuits includes at least one transmit gate, each transmit gate being formed by an NMOS transistor and a PMOS transistor connected in parallel.

39. The semiconductor memory as defined in claim 35, further comprising:

a second intermediate data bus extending in the second direction and arranged adjacent to the first intermediate data bus; and a second data buffer circuit for amplifying data, the second data buffer circuit being connected to the second intermediate data bus and the main data bus.

40. The semiconductor memory as defined in claim 39, further comprising:

a first upper switch circuit for selectively coupling the first upper data bus to the first intermediate data bus;

a second upper switch circuit for selectively coupling the second upper data bus to the second intermediate data bus;

a third upper switch circuit for selectively coupling the third upper data bus to the first intermediate data bus;

a first lower switch circuit for selectively coupling the first lower data bus to the first intermediate data bus;

a second lower switch circuit for selectively coupling the second lower data bus to the second intermediate data bus; and a third lower switch circuit for selectively coupling the third lower data bus to the first intermediate data bus, wherein either:
- the first upper switch circuit couples the first upper data bus to the first intermediate data bus, and the second upper switch circuit couples the second upper data bus to the second intermediate data bus, to select the first upper memory cell array, or
- the third upper switch circuit couples the third upper data bus to the first intermediate data bus, and the second upper switch circuit couples the second upper data bus to the second intermediate data bus, to select the second upper memory cell array, or
- the first lower switch circuit couples the first lower data bus to the first intermediate data bus, and the second lower switch circuit couples the second lower data bus to the second intermediate data bus, to select the first lower memory cell array, or
- the third lower switch circuit couples the third lower data bus to the first intermediate data bus, and the second lower switch circuit couples the second lower data bus to the second intermediate data bus, to select the second lower memory cell array.

41. The semiconductor memory as defined in claim 40, wherein each of the first to the third upper data busses, each of the first to the third lower data busses, and each of the first and the second intermediate data busses has W wirings (W≧1), each of the first to the third upper switch circuits and each of the first to the third lower switch circuits has W switch elements for connecting and disconnecting corresponding wirings of the data busses, and each of the switch elements includes at least one transmit gate, each transmit gate being formed by an NMOS transistor and a PMOS transistor connected in parallel.

42. The semiconductor memory as defined in claim 41, wherein W is eight.

43. The semiconductor memory as defined in claim 39, further comprising:

a fourth and a fifth upper data bus extending in the first direction;

a third upper memory cell array having a plurality of memory cells arranged in a matrix, the third upper memory cell array arranged between the third and the fourth upper data busses;

a fourth upper memory cell array having a plurality of memory cells arranged in a matrix, the fourth upper memory cell array arranged between the fourth and the fifth upper data busses;

a fourth and a fifth lower data bus extending in the first direction;

a third lower memory cell array having a plurality of memory cells arranged in a matrix, the third lower memory cell array arranged between the third and the fourth lower data busses; and a fourth lower memory cell array having a plurality of memory cells arranged in a matrix, the fourth lower memory cell array arranged between the fourth and the fifth lower data busses, wherein the first and the second intermediate data busses further extend in parallel along an end of the third and the fourth upper memory cell arrays, the first upper data bus is selectively coupled to the first intermediate data bus, the second upper data bus is selectively coupled to the second intermediate data bus, the third upper data bus is selectively coupled to the first intermediate data bus, the fourth upper data bus is selectively coupled to the second intermediate data bus, and the fifth upper data bus is selectively coupled to the first intermediate data bus, and the first lower data bus is selectively coupled to the first intermediate data bus, the second lower data bus is selectively coupled to the second intermediate data bus, the third lower data bus is selectively coupled to the first intermediate data bus, the fourth lower data bus is selectively coupled to the second intermediate data bus, and the fifth lower data bus is selectively coupled to the first intermediate data bus.

44. The semiconductor memory as defined in claim 43, further comprising:

a first upper switch circuit for selectively coupling the first upper data bus to the first intermediate data bus;

a second upper switch circuit for selectively coupling the second upper data bus to the second intermediate data bus;

a third upper switch circuit for selectively coupling the third upper data bus to the first intermediate data bus;

a fourth upper switch circuit for selectively coupling the fourth upper data bus to the second intermediate data bus;

a fifth upper switch circuit for selectively coupling the fifth upper data bus to the first intermediate data bus;

a first lower switch circuit for selectively coupling the first lower data bus to the first intermediate data bus;

a second lower switch circuit for selectively coupling the second lower data bus to the second intermediate data bus;

a third lower switch circuit for selectively coupling the third lower data bus to the first intermediate data bus;

a fourth lower switch circuit for selectively coupling the fourth lower data bus to the second intermediate data bus; and a fifth lower switch circuit for selectively coupling the fifth lower data bus to the first intermediate data bus, wherein either:
- the first upper switch circuit couples the first upper data bus to the first intermediate data bus, and the second upper switch circuit couples the second upper data bus to the second intermediate data bus, to select the first upper memory cell array, or
- the third upper switch circuit couples the third upper data bus to the first intermediate data bus, and the second upper switch circuit couples the second upper data bus to the second intermediate data bus, to select the second upper memory cell array, or
- the third upper switch circuit couples the third upper data bus to the first intermediate data bus, and the fourth upper switch circuit couples the fourth upper data bus to the second intermediate data bus, to select the third upper memory cell array, or
- the fifth upper switch circuit couples the fifth upper data bus to the first intermediate data bus, and the fourth upper switch circuit couples the fourth upper data bus to the second intermediate data bus, to select the fourth upper memory cell array, or
- the first lower switch circuit couples the first lower data bus to the first intermediate data bus, and the second lower switch circuit couples the second lower data bus to the second intermediate data bus, to select the first lower memory cell array, or the third lower switch circuit couples the third lower data bus to the first intermediate data bus, and the second lower switch circuit couples the second lower data bus to the second intermediate data bus, to select the second lower memory cell array, or the third lower switch circuit couples the third lower data bus to the first intermediate data bus, and the fourth lower switch circuit couples the fourth lower data bus to the second intermediate data bus, to select the third lower memory cell array, or the fifth lower switch circuit couples the fifth lower data bus to the first intermediate data bus, and the fourth lower switch circuit couples the fourth lower data bus to the second intermediate data bus, to select the fourth lower memory cell array.

45. The semiconductor memory as defined in claim 44, wherein each of the first to the fifth upper data busses has W wirings (W≧1), each of the first to the fifth lower data busses has W wirings, the first intermediate data bus and the second intermediate data bus each have W wirings, each of the first to the fifth upper switch circuits has W switch elements for connecting and disconnecting corresponding wirings of the data busses, each of the first to the fifth lower switch circuits has W switch elements for connecting and disconnecting corresponding wirings of the data busses, and each of the switch elements has at least one transmit gate.

46. A memory block of the type used in a semiconductor memory, comprising:

N upper memory cell arrays, each upper memory cell array being selectively activated;

N+1 upper data busses arranged in parallel;

a first intermediate data bus arranged perpendicularly to the upper data busses;

N+1 upper switch circuits, each of the upper switch circuits being connected to one of the N+1 upper data busses;

N lower memory cell arrays, each lower memory cell array being selectively activated;

N+1 lower data busses arranged in parallel;

N+1 lower switch circuits, each of the lower switch circuits being connected to one of the N+1 lower data busses, wherein the upper data busses are arranged alternately with the upper memory cell arrays, the lower data busses are arranged alternately with the lower memory cell arrays, N/2 of the N+1 upper switch circuits operate to selectively couple the corresponding upper data bus to the first intermediate data bus, and N/2 of the N+1 lower switch circuits operate to selectively couple the corresponding lower data bus to the first intermediate data bus.

47. The memory block as defined in claim 46, further comprising a first buffer circuit connected to the first intermediate data bus.

48. The memory block as defined in claim 47, further comprising:

N+1 upper groups of sense amplifier circuits, each upper group of sense amplifier circuits corresponding to and arranged with one of the N+1 upper data busses; and N+1 lower groups of sense amplifier circuits, each lower group of sense amplifier circuits corresponding to and arranged with one of the N+1 lower data busses.

49. The memory block as defined in claim 47, further comprising:

N upper row decode circuits, each of the upper row decode circuits corresponding to one of the N upper memory cell arrays and being arranged between the corresponding upper memory cell array and the first intermediate data bus; and N lower row decode circuits, each of the lower row decode circuits corresponding to one of the N lower memory cell arrays and being arranged between the corresponding lower memory cell array and the first intermediate data bus.

50. The memory block as defined in claim 47, further comprising a main data bus connected to the first buffer circuit.

51. The memory block as defined in claim 50, further comprising:

a second intermediate data bus arranged in parallel with the first intermediate data bus; and a second buffer circuit arranged adjacent to the first buffer circuit, the second buffer circuit being connected to the main data bus and the second intermediate data bus, wherein ((N/2)+1) of the N+1 upper switch circuits each operate to selectively couple the corresponding upper data bus to the second intermediate data bus, and ((N/2)+1) of the N+1 lower switch circuits each operate to selectively couple the corresponding lower data bus to the second intermediate data bus.

52. The memory block as defined in claim 51, wherein each of the upper data busses has W wirings (W≧1), each of the lower data busses has W wirings, the first intermediate data bus and the second intermediate data bus each have W wirings, and each of the upper switch circuits and each of the lower switch circuits have W switch elements for connecting and disconnecting corresponding wirings of the data busses, each of the switch elements having at least one transmit gate.

53. The memory block as defined in claim 51, wherein N is four.

54. The memory block as defined in claim 51, wherein N is eight.

55. The memory block as defined in claim 51, wherein k is an integer greater than or equal to one, and N satisfies the equation $N=2^k$.

56. A semiconductor memory, comprising:

M memory blocks, each memory block including:

N upper memory cell arrays, each upper memory cell array being selectively activated;

N+1 upper data busses arranged in parallel, the upper data busses being arranged alternately with the upper memory cell arrays;

a first data bus arranged perpendicularly to the upper data busses;

a second data bus arranged in parallel with the first data bus;

N lower memory cell arrays, each lower memory cell array being selectively activated;

N+1 lower data busses arranged in parallel, the lower data busses being arranged alternately with the lower memory cell arrays;

N+1 upper switch circuits, each of the upper switch circuits being connected to one of the upper data busses such that N/2 of the N+1 upper switch circuits each operate to selectively couple the corresponding upper data bus to the first data bus and ((N/2)+1) of the N+1 upper switch circuits each operate to selectively couple the corresponding upper data bus to the second data bus;

N+1 lower switch circuits, each of the lower switch circuits being connected to one of the lower data busses such that N/2 of the N+1 lower switch circuits each operate to selectively couple the corresponding lower data bus to the first data bus and ((N/2)+1) of the N+1 lower switch circuits each operate to selectively couple the corresponding lower data bus to the second data bus;

a first buffer circuit connected to the first data bus; and a second buffer circuit connected to the second data bus; and a main data bus, a portion of the main data bus being connected to the M first buffer circuits and another portion of the main data bus being connected to the M second buffer circuits, wherein adjacent memory blocks share an upper data bus so that in every memory block except the first memory block, the number one upper data bus for one memory block is the same as the number N+1 upper data bus for the next memory block, and adjacent memory blocks share a lower data bus so that in every memory block except the first memory block, the number one lower data bus for one memory block is the same as the number N+1 lower data bus for the next memory block.

57. The semiconductor memory as defined in claim 56, further comprising a control circuit for controlling the first and the second buffer circuits, the control circuit operating to selectively couple data from the first and the second buffer circuits of one of the M memory blocks to the main data bus.

58. The semiconductor memory as defined in claim 57, wherein each of the M memory blocks further includes:

N+1 upper groups of sense amplifier circuits, each upper group of sense amplifier circuits corresponding to and arranged with one of the N+1 upper data busses, thereby allowing adjacent memory blocks to also share an upper group of sense amplifier circuits; and N+1 lower groups of sense amplifier circuits, each lower group of sense amplifier circuits corresponding to and arranged with one of the N+1 lower data busses, thereby allowing adjacent memory blocks to also share a lower group of sense amplifier circuits.

59. The semiconductor memory as defined in claim 57, wherein each of the M memory blocks further includes:

N upper row decode circuits, each of the upper row decode circuits corresponding to one of the N upper memory cell arrays in the memory block and being arranged between the corresponding upper memory cell array and the first data bus of the memory block; and N lower row decode circuits, each of the lower row decode circuits corresponding to one of the N lower memory cell arrays in the memory block and being arranged between the corresponding lower memory cell array and the first data bus of the memory block.

60. The semiconductor memory as defined in claim 57, wherein each of the upper data busses and each of the lower data busses have W wirings (W≧1), each of the first data busses and each of the second data busses have W wirings, and each of the upper switch circuits and each of the lower switch circuits have W switch elements for connecting and disconnecting corresponding wirings of the data busses, each of the switch elements having at least one transmit gate.

61. The semiconductor memory as defined in claim 60, wherein each of the W switch elements in each upper switch circuit that is connected to one of the upper data busses shared by adjacent memory blocks has two transmit gates, each of the two transmit gates selectively coupling the corresponding upper data bus to the second data bus of one of the two adjacent memory blocks, each of the W switch elements in each lower switch circuit that is connected to one of the lower data busses shared by adjacent memory blocks has two transmit gates, each of the two transmit gates selectively coupling the corresponding lower data bus to the second data bus of one of the two adjacent memory blocks, and each of the switch elements in each of the remaining upper switch circuits and each of the switch elements in each of the remaining lower switch circuits have one transmit gate.

62. The semiconductor memory as defined in claim 60, wherein each of the W switch elements in each upper switch circuit that is connected to one of the upper data busses shared by adjacent memory blocks has two transmit gates, each of the two transmit gates selectively coupling the corresponding upper data bus to the second data bus of one of the two adjacent memory blocks, each of the W switch elements in another upper switch circuit in each memory block has two transmit gates, each of the two transmit gates selectively coupling the corresponding upper data bus to the first data bus of one of the two adjacent groups of memory cell arrays, each of the W switch elements in each lower switch circuit that is connected to one of the lower data busses shared by adjacent memory blocks has two transmit gates, each of the two transmit gates selectively coupling the corresponding lower data bus to the second data bus of one of the two adjacent memory blocks, each of the W switch elements in another lower switch circuit in each memory block has two transmit gates, each of the two transmit gates selectively coupling the corresponding lower data bus to the first data bus of one of the two adjacent groups of memory cell arrays, and each of the switch elements in each of the remaining switch circuits has one transmit gate.

63. The semiconductor memory as defined in claim 57, wherein N is four.

64. The semiconductor memory as defined in claim 57, wherein N is eight.

65. The semiconductor memory as defined in claim 57, wherein k is an integer greater than or equal to one, and N satisfies the equation $N=2^k$.

* * * * *